US010440840B2

United States Patent
Ochi et al.

(10) Patent No.: US 10,440,840 B2
(45) Date of Patent: Oct. 8, 2019

(54) FLEXIBLE DEVICE

(71) Applicant: Sharp Kabushiki Kaisha, Sakai, Osaka (JP)

(72) Inventors: Takashi Ochi, Sakai (JP); Takeshi Hirase, Sakai (JP); Tetsuya Okamoto, Sakai (JP); Tohru Senoo, Sakai (JP); Tohru Sonoda, Sakai (JP); Mamoru Ishida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/762,135

(22) PCT Filed: Sep. 20, 2016

(86) PCT No.: PCT/JP2016/077621
§ 371 (c)(1),
(2) Date: Mar. 22, 2018

(87) PCT Pub. No.: WO2017/051788
PCT Pub. Date: Mar. 30, 2017

(65) Prior Publication Data
US 2018/0279489 A1   Sep. 27, 2018

(30) Foreign Application Priority Data
Sep. 24, 2015   (JP) ................. 2015-187430

(51) Int. Cl.
*H05K 5/00*   (2006.01)
*E05D 7/00*   (2006.01)
(Continued)

(52) U.S. Cl.
CPC ............. *H05K 5/0017* (2013.01); *E05D 7/00* (2013.01); *H01L 51/5237* (2013.01); *H04M 1/022* (2013.01); *H05K 5/0004* (2013.01); *H05K 5/0226* (2013.01); *E05D 1/02* (2013.01); *E05Y 2201/716* (2013.01); *E05Y 2900/606* (2013.01); *H01L 2251/5338* (2013.01)

(58) Field of Classification Search
USPC ....................................................... 361/755
See application file for complete search history.

(56) References Cited

U.S. PATENT DOCUMENTS 8,243,459 B2 *   8/2012   Hoshino ............... G06F 1/1616
                                                        361/715
9,572,272 B2 *   2/2017   Lee ..................... H04M 1/0216
(Continued)

FOREIGN PATENT DOCUMENTS

JP   2013-050547 A   3/2013
JP   2016-133807 A   7/2016

*Primary Examiner* — Hung S. Bui
(74) *Attorney, Agent, or Firm* — Keating & Bennett, LLP

(57) ABSTRACT

The present invention provides a flexible device which is free of twist and distortion at a bent part of a flexible module, and has excellent display quality and a high level of reliability. The flexible device (1) includes a first housing (31), a second housing (41), a third housing (61), and a plurality of turning bodies (80) each of which is fixed to the first housing (31) or the second housing (41) and rolls on the third housing (61) so that a turning axis (80*a*) of the each of the plurality of turning bodies (80) horizontally moves.

13 Claims, 17 Drawing Sheets

(51) Int. Cl.
*H01L 51/52* (2006.01)
*H05K 5/02* (2006.01)
*H04M 1/02* (2006.01)
*E05D 1/02* (2006.01)

(56) References Cited

U.S. PATENT DOCUMENTS 10,168,734 B2 * 1/2019 Sun .................. G06F 1/1618
2016/0212840 A1 7/2016 Koo et al.

* cited by examiner

FLEXIBLE DEVICE

TECHNICAL FIELD

The present invention relates to a foldable flexible device which includes a flexible module such as a flexible display.

BACKGROUND ART

In recent years, as electronic devices such as a laptop PC, a mobile phone, and a mobile information terminal are increasingly becoming used for mobile purposes, there is a growing demand for reduction in size of the devices themselves in order to improve portability.

On the other hand, in order to increase an amount of information and improve visibility and operability, it is desirable that a display section and an operation section be larger.

Accordingly, development has been conducted in order to develop a foldable device that includes two housings joined together by a hinge structure so as to be openable and closable, as well as development of a bendable flexible module as a module to be included in such a housing. In particular, a so-called flexible display, which has a flexibly deformable display part, has been drawing great attention in recent years as a display module that is thin, light-weight, and bendable.

A foldable flexible device that includes such a flexible module can have a reduced projection area of the entire flexible device when the flexible device is closed (i.e., folded), and can have increased areas of a display section and an operation section when the flexible device is opened (i.e., unfolded), due to an increase in surface area of the flexible device.

However, the foldable flexible device has a problem that a flexible module and a housing become misaligned when the flexible device is folded and when the flexible device is unfolded. In order to absorb such a misalignment, various techniques have been proposed (for example, see Patent Literature 1).

(a) through (c) of FIG. 17 are views each illustrating a schematic configuration of a main part of a display device 300 disclosed in Patent Literature 1. (a) of FIG. 17 is a view illustrating a state in which the display device 300 is folded, the view including an enlarged view of the main part. (b) of FIG. 17 is a view illustrating the display device 300 which is being unfolded, the view including an enlarged view of the main part. (c) of FIG. 17 is a view illustrating a state in which the display device 300 is unfolded, the view including an enlarged view of the main part.

As illustrated in (a) through (c) of FIG. 17, Patent Literature 1 discloses, as a foldable flexible device, the display device 300 which includes, as a flexible module, a display panel 304 which is flexible. The display device 300 includes housings 301 and 302 which are joined together by a hinge section 303 so as to be openable and closable. The hinge section 303 has an independent structure which follows neither turning of the housing 301 nor turning of the housing 302. The hinge section 303 includes a protruding shaft part 305 which is maintained in a predetermined position even in a case where the housings 301 and 302 turn.

A circle 306, which is illustrated in (a) through (c) of FIG. 17, is a circle that (i) centers around a turning axis 303a, which is a center axis of the hinge section 303 and (ii) coincides with a shape of an outer periphery of the hinge section 303. In a case where (i) the turning axis 303a is a center, (ii) an intersection between the circle 306 and a surface of the housing 301 on which surface the display panel 304 is laid is a first intersection a1, and (iii) an intersection between the circle 306 and a surface of the housing 302 on which surface the display panel 304 is laid is a first intersection b1, a portion connecting between the first intersection a1 and the second intersection b1 is a bent part 304a (a flexion part) of the display panel 304. The bent part 304a of the display panel 304 expands and contracts as the display device 300 is folded.

In Patent Literature 1, the following structure is employed so that misalignment between the display panel 304 and each of the housings 301 and 302 hardly occurs between a state in which the display device 300 is bent and a state in which the display device 300 is unfolded. That is, Patent Literature 1 employs a structure in which, when viewed along the turning axis 303a, (i) the bent part 304a of the display panel 304 is not fixed to the surface of each of the housings 301 and 302 on which surface the display panel 304 is laid, and (ii) the bent part 304a has a length D which is set to be substantially equal to a diameter of the circle 306 as illustrated in (b) of FIG. 17 and, in a state where the display device 300 is unfolded, be slightly longer than a linear distance between the first intersection a1 and the second intersection b1 as illustrated in (c) of FIG. 17.

CITATION LIST

Patent Literature

[Patent Literature 1]
Japanese Patent Application Publication, Tokukai, No. 2013-50547 A (Publication Date: Mar. 14, 2013)

SUMMARY OF INVENTION

Technical Problem

However, during a flexion motion of the display panel 304 of the display device 300 disclosed in Patent Literature 1, the first intersection a1 and the second intersection b1 move, in a state where the turning axis 303a is fixed, on a circumference of the circle 306 as indicated by reference numerals a1 through a3 and b1 through b3 in (a) through (c) of FIG. 17.

In Patent Literature 1, in order to reduce the misalignment described above, it is important that a diameter D (D=sin ($\theta_0+\theta$)) of the circle 306 and a linear distance (D sin($\theta_0+\theta_m$)) between a3 and b3, which portion is the bent part 304a, be as equal as possible to each other. Note here that $\theta_0$ represents an angle between (i) each of segments, which respectively connect the first intersection a1 and the second intersection b1 with a center of turning (turning axis 303a) of the housings 301 and 302 in (a) of FIG. 17 and (ii) a plane that includes a center line (a line that passes the turning axis 303a so as to extend in a top-bottom direction of (a) of FIG. 17) of the display device 300. Further, $\theta$ is an unfolding angle with reference to a state in which the display device 300 is folded as illustrated in (a) of FIG. 17, and $\theta_0+\theta=90°$. Further, $\theta_m$ is an unfolding angle in a state in which the display device 300 is unfolded as illustrated in (c) of FIG. 17.

In order for the diameter D of the circle 306 to be as equal as possible to the linear distance between a3 and b3, which portion is the bent part 304a, it is necessary that a distance between a2 and a3 on the circumference of the circle 306 and a distance between b2 and b3 on the circumference of the circle 306 be each set as short as possible in a state in which the display device 300 is unfolded as illustrated in (c) of FIG. 17.

According to a housing mechanism of Patent Literature 1, a flexing and unfolding action is carried out by turning each of the housing 301 and the housing 302 outward by 90°.

Accordingly, in order to reduce the distance between a2 and a3 on the circumference of the circle 306 and the distance between b2 and b3 on the circumference of the circle 306 in the state in which the display device 300 is unfolded as illustrated in (c) of FIG. 17, it is necessary to reduce a linear distance ($D \sin \theta_0$) between a1 and b1 in the state in which the display device 300 is folded as illustrated in (a) of FIG. 17.

In actual design, the linear distance ($D \sin \theta_0$) between a1 and b1 in the state in which the display device 300 is folded as illustrated in (a) of FIG. 17 needs to be set in consideration of a thickness of the display panel 304 and a clearance, and it is assumed that the thickness needs at least 0.5 mm.

When the value 0.5 mm is converted into a rate of margin with respect to a linear distance between a3 and b3 in the state in which the display device 300 is unfolded as illustrated in (c) of FIG. 17=(a linear distance between a2 and b2 in the state in which the display device 300 is unfolded–a linear distance between a3 and b3 in the state in which the display device 300 is unfolded)/the linear distance between a3 and b3 in the state in which the display device 300 is unfolded, the rate of margin is 0.076%, which is a very small value. Note here that the linear distance between a2 and b2 in the state in which the display device 300 is unfolded is represented by D. Further, the linear distance between a3 and b3 in the state in which the display device 300 is unfolded is represented by $D \sin(\theta_0 + \theta_m)$.

However, with use of an actual display panel, the inventors of the present invention have confirmed that even at the rate of margin above, the housing mechanism, when actually designed, has an undulation visible on a display surface.

This is a big problem because it suggests not only that deterioration in display quality of a display panel (flexible module) is caused by a twist or a distortion of the display panel (flexible module) when the display surface is touched (e.g., when a touch panel is operated) but also that an undulation on the display surface is always observed even when the display surface is not touched.

Note that, although not disclosed in Patent Literature 1, if the display device 300 of Patent Literature 1 is designed such that a linear distance (a linear distance between a3 and b3 in (c) of FIG. 17) between fixed ends of the display panel 304 in a state in which the display device 300 is unfolded is equal to a length of the bent part 304a of the display panel 304, the linear distance between the fixed ends in turn becomes longer than a length of the bent part 304a of the display panel 304 while a folding action is being carried out (the linear distance between a2 and b2 in (c) of FIG. 17). This causes stress on the display panel 304.

That is, in the structure disclosed in Patent Literature 1, the problems above always occur in a flexed state, a stretched state, and in a state between the flexed state and the stretched state.

Further, in Patent Literature 1, reducing the linear distance between the first intersection a1 and the second intersection b1 in (a) of FIG. 17 itself has a problem.

(a) of FIG. 18 is a view schematically illustrating a state of the display panel 304 in a case where a length of the bent part 304a of the display panel 304 is not more than a half of a flexion circumference. (b) of FIG. 18 is a view schematically illustrating a state of the display panel 304 in a case where the length of the bent part 304a of the display panel 304 is more than the half of the flexion circumference. (c) of FIG. 18 is a view schematically illustrating the bent part 304a of the display panel 304 at portions 304b at which the display panel 304 is flexed in an S-shape.

Generally, a display panel has a lower limit for a flexion diameter up to which the display panel can be bent. As such, in order to achieve a sufficient reduction in linear distance between the first intersection a1 and the second intersection b1 in (a) of FIG. 17, it is essential to have a structure in which, as illustrated in (b) of FIG. 18, the display panel 304 is flexed beyond the half of the flexion circumference. Note here that the flexion circumference means a circumference of a circle that includes the bent part 304a (the flexion part) of the display panel 304 as part of an arc of the circle, and specifically means a circumference of the circle 306. Further, the structure in which the display panel 304 is flexed beyond the half of the flexion circumference means a structure in which an arc angle of the bent part 304a exceeds 180°.

In the structure illustrated in (b) of FIG. 18, it is necessary that the display panel 304 be flexed beyond the half of the flexion circumference (the circumference of the circle 306). Accordingly, a length of the bent part 304a which is not fixed to the housings 301 and 302 is increased. Specifically, the length almost doubles as compared with, for example, a case in which the length of the bent part 304a is a half of the flexion circumference (a case in which the arc angle of the bent part 304a is 180° in (a) of FIG. 18).

Further, in Patent Literature 1, the display panel 304 flexes so as to wrap the protruding shaft part 305 of the hinge section 303 when the display device 300 is folded (i.e., the display panel 304 is flexed) as illustrated in FIG. 17. Accordingly, the arc angle of the bent part 304a of the display panel 304 exceeds 180°, so that, as indicated by a bold line in (b) of FIG. 18, the display panel 304 partially flexes in a direction (an S-shape) opposite to a direction (i.e., a direction in which the display panel 304 is supposed to flex) in which the display panel 304 is folded.

Accordingly, in reality, a limit flexion diameter of the display panel 304 needs to be taken into consideration also at the portions 304b, indicated by a flexion angle α in (b) of FIG. 18, where the display panel 304 is flexed in an S-shape. As such, as a solid line indicates the bent part 304a in (c) of FIG. 18, at each of the portions 304b and 304b where the display panel 304 is flexed in an S-shape, the length of the bent part 304a needs to be, by simple arithmetic, at least 1.5 times that of a case illustrated in (a) of FIG. 18 in which the length of the bent part 304a is half the flexion circumference.

Accordingly, in the structure of Patent Literature 1, the length of the bent part 304a of the display panel 304 needs to be not less than three times that of a case in which the length of the bent part 304a is a half of the flexion circumference.

As described above, in Patent Literature 1, the bent part 304a which is not fixed to the housings 301 and 302 has an increased length, so that degradation in display quality due to a twist or a distortion becomes even more significant.

The present invention is accomplished in view of the foregoing problem. An object of the present invention is to provide a flexible device which is free of twist and distortion at a bent part of a flexible module, and has excellent display quality and a high level of reliability.

Solution to Problem

In order to attain the object, a flexible device in accordance with one aspect of the present invention is a flexible device, including: a flexible module; and a holding body holding the flexible module, the holding body including: a first housing and a second housing facing each other when the flexible module is bent; and a connection section connecting the first housing and the second housing to each other so that the first housing and the second housing are turnable, a surface of the flexible module which surface faces the first housing and the second housing being fixed to the first housing and the second housing, the connection section including: a third housing disposed so as to face a bent part of the flexible module; and a plurality of turning bodies, each of the plurality of turning bodies being fixed to the first housing or the second housing, the plurality of turning bodies rolling on the third housing so that a turning axis of the each of the plurality of turning bodies horizontally moves when the flexible module is bent.

Advantageous Effects of Invention

According to one aspect of the present invention, it is possible to provide a flexible device which is free of twist and distortion at a bent part of a flexible module, and has excellent display quality and a high level of reliability.

BRIEF DESCRIPTION OF DRAWINGS (a) through (c) of FIG. 1 are views each schematically illustrating a schematic configuration of a main part of a flexible device in accordance with Embodiment 1 of the present application, together with turnings of circles 11 and 12 respectively centering around turning axes of a flexible module.

(a) through (c) of FIG. 2 are perspective views each schematically illustrating an appearance of a device main body of the flexible device in accordance with Embodiment 1 of the present application.

(a) through (d) of FIG. 3 are perspective views each schematically illustrating a schematic configuration of a main part of the flexible device in accordance with Embodiment 1 of the present invention.

Figure 6:
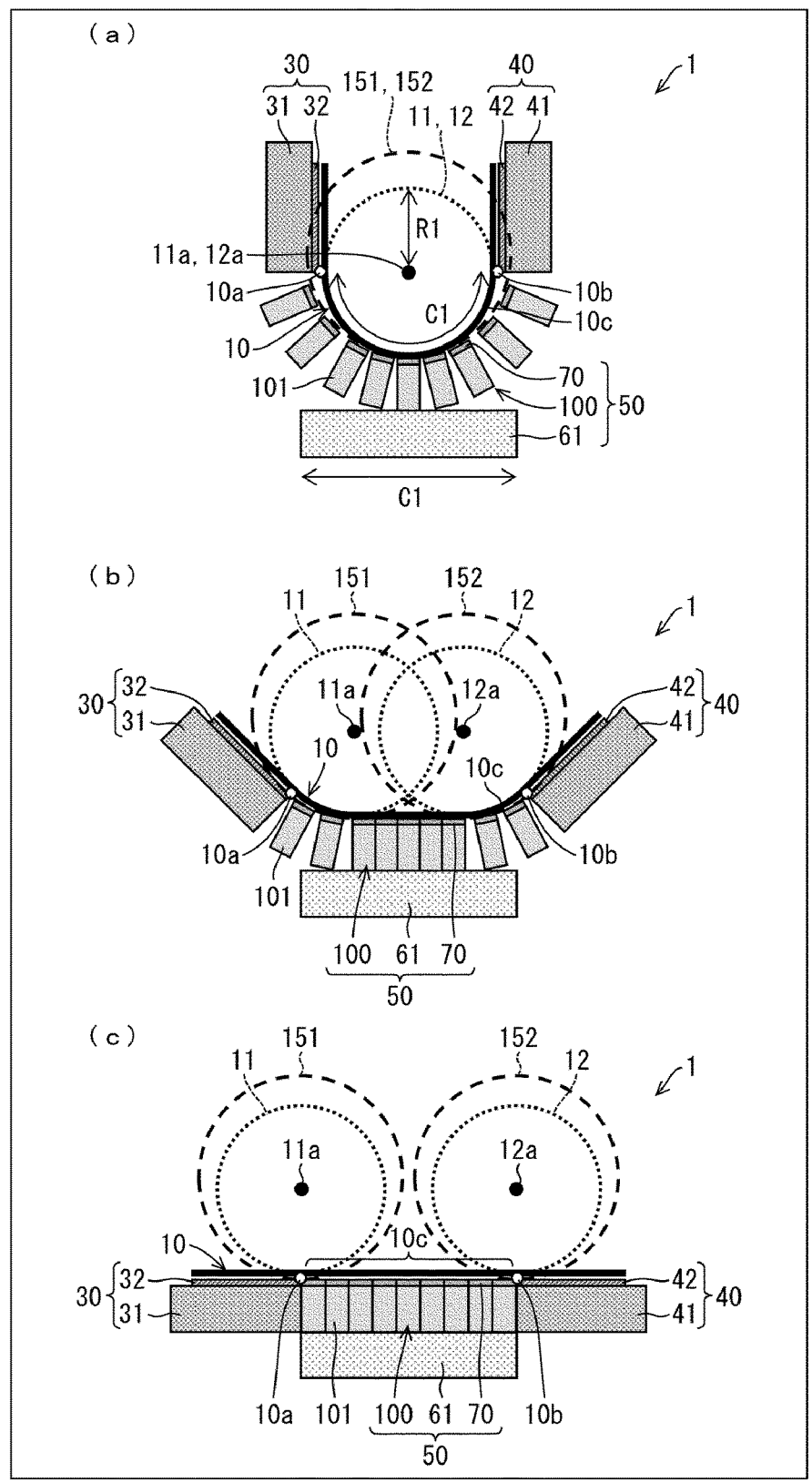

(a) through (c) of FIG. 6 are views each schematically illustrating a schematic configuration of a main part of a flexible device in accordance with Embodiment 2, together with turnings of circles centering around respective turning axes of a flexible module as well as turnings of circles centering around respective engaging protrusions which are connected respectively to a first sliding member and a second sliding member.

Figure 7:
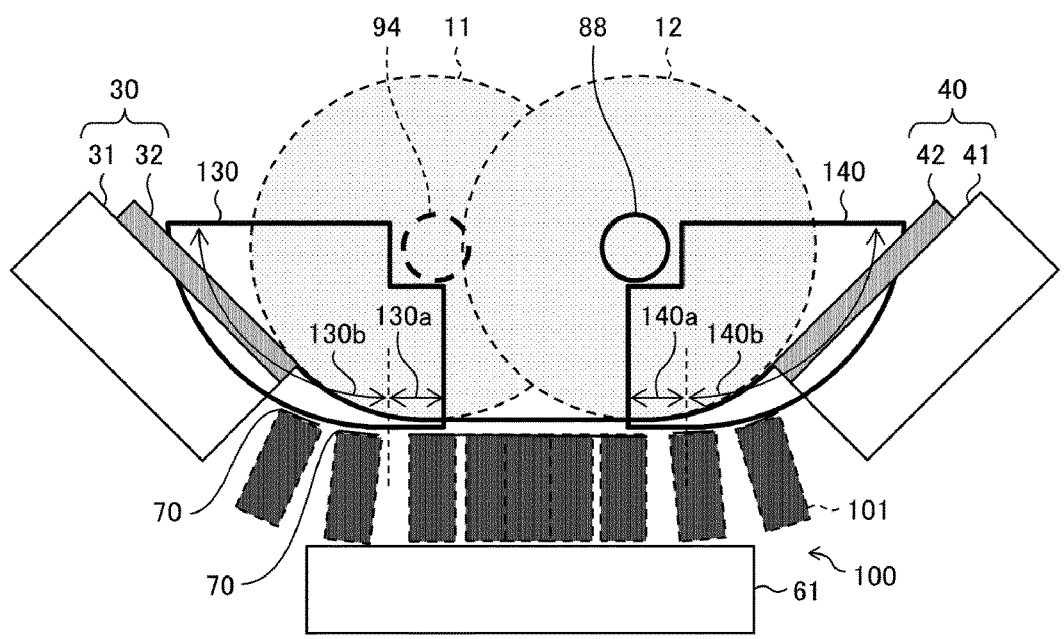

FIG. 7 is a view schematically illustrating how back surface supporting members of the flexible device in accordance with Embodiment 2 of the present invention move along the first sliding member and the second sliding member.

Figure 8:
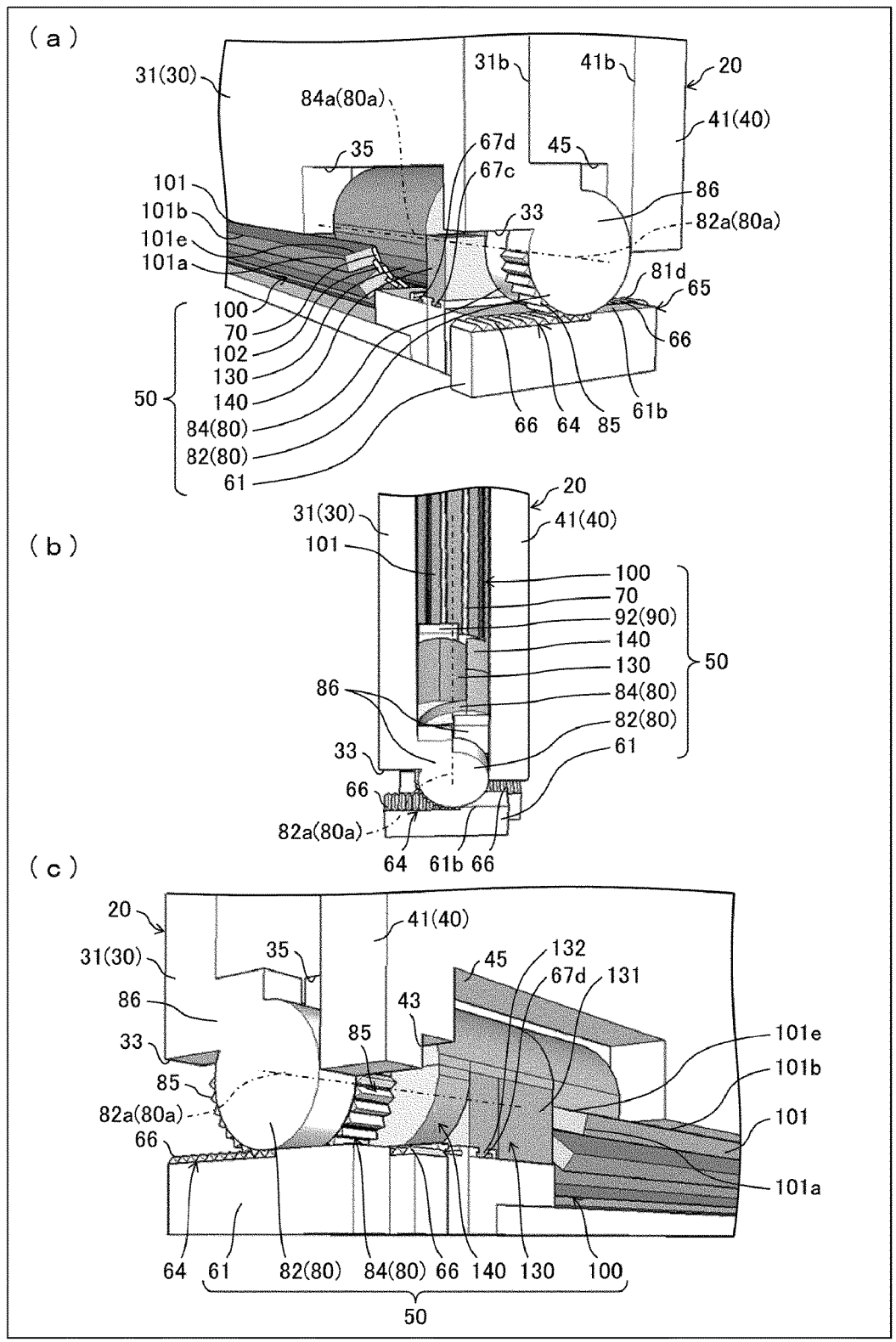

(a) through (c) of FIG. 8 are perspective views each illustrating a schematic configuration of a main part of the flexible device in accordance with Embodiment 2 of the present invention in a state in which the flexible device is folded, the views showing the main part as viewed from respective different angles.

Figure 9:
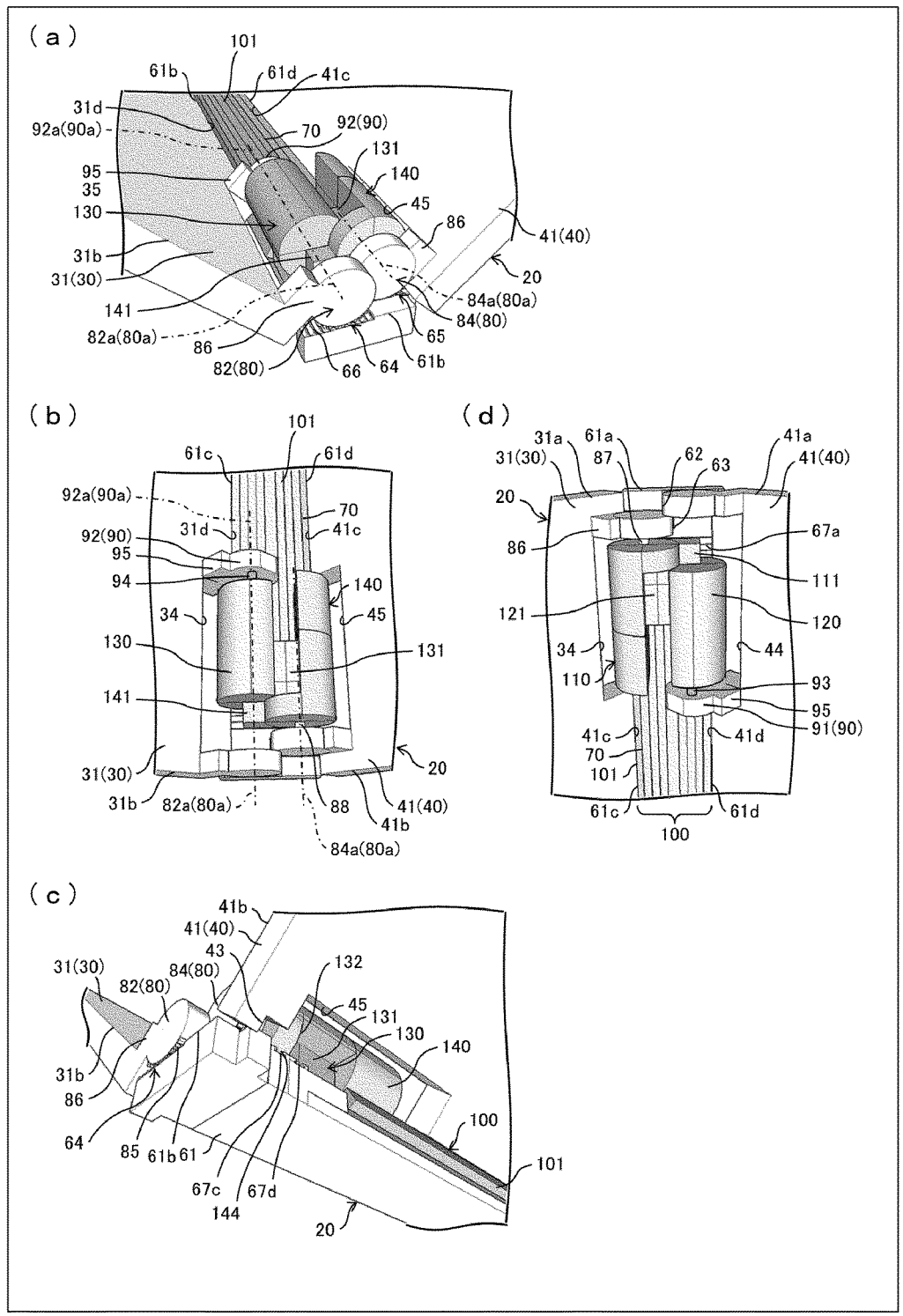

(a) through (d) of FIG. 9 are perspective views each illustrating a schematic configuration of a main part of the flexible device in accordance with Embodiment 2 of the present invention in a state in which the flexible device is unfolded by 90°, the views showing the main part as viewed from respective different angles.

Figure 10:
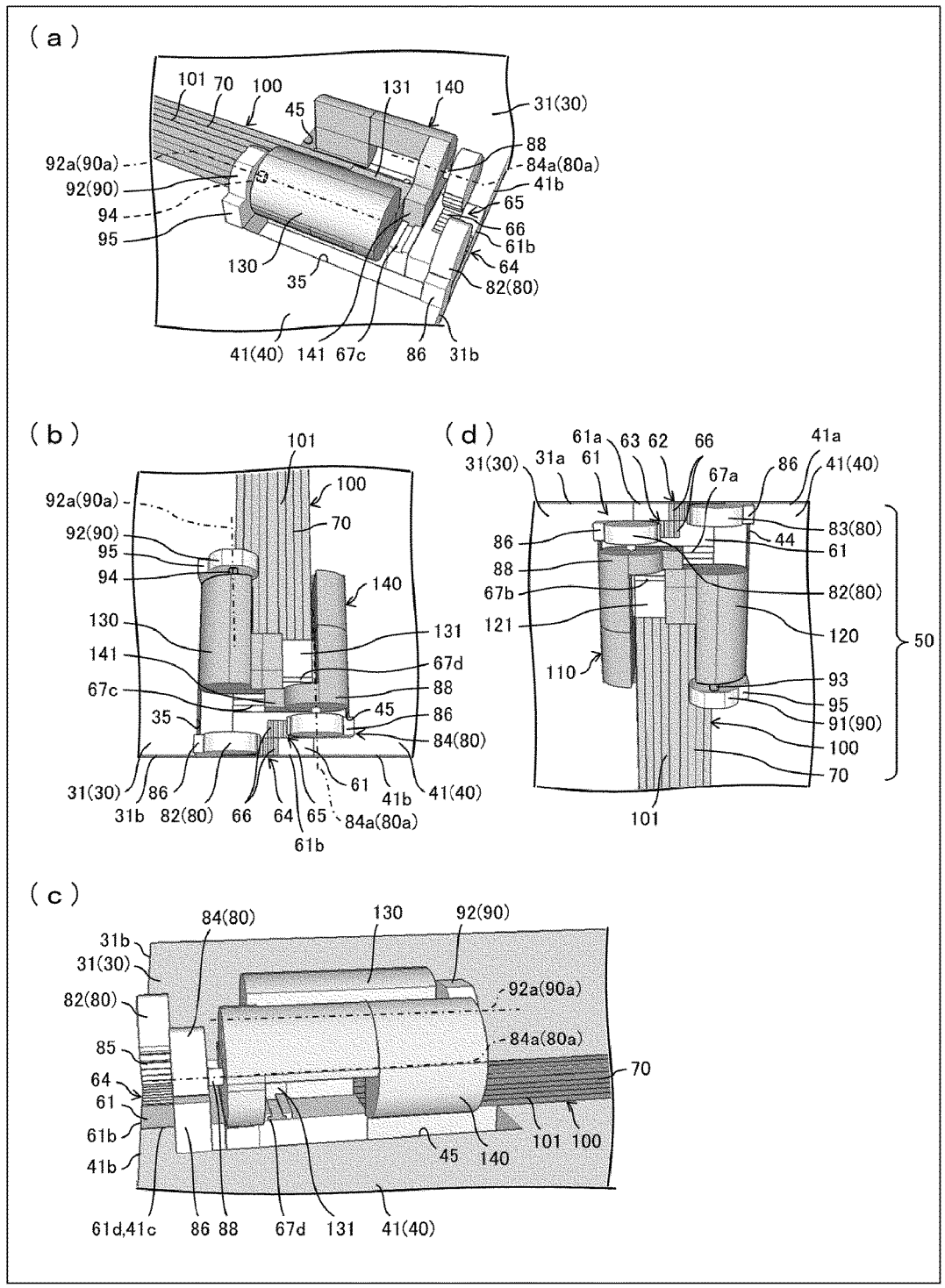

(a) through (d) of FIG. 10 are perspective views each illustrating a schematic configuration of a main part of the flexible device in accordance with Embodiment 2 of the present invention in a state in which the flexible device is unfolded by 180°, the views showing the main part as viewed from respective different angles.

Figure 11:
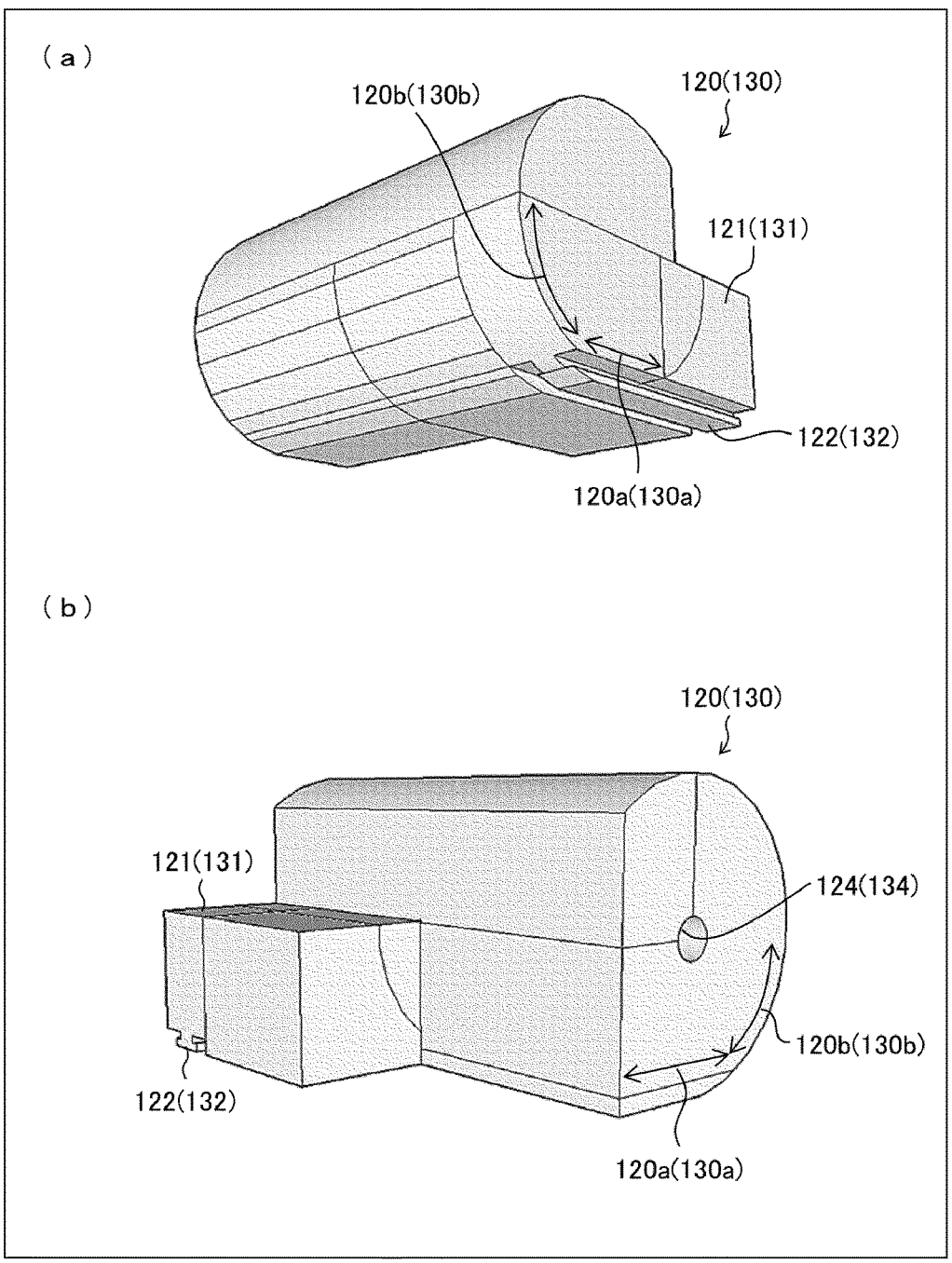

(a) and (b) of FIG. 11 are perspective views each illustrating a schematic configuration of second sliding members of the flexible device in accordance with Embodiment 2 of the present invention, the views showing the second sliding members as viewed from respective different angles.

Figure 12:
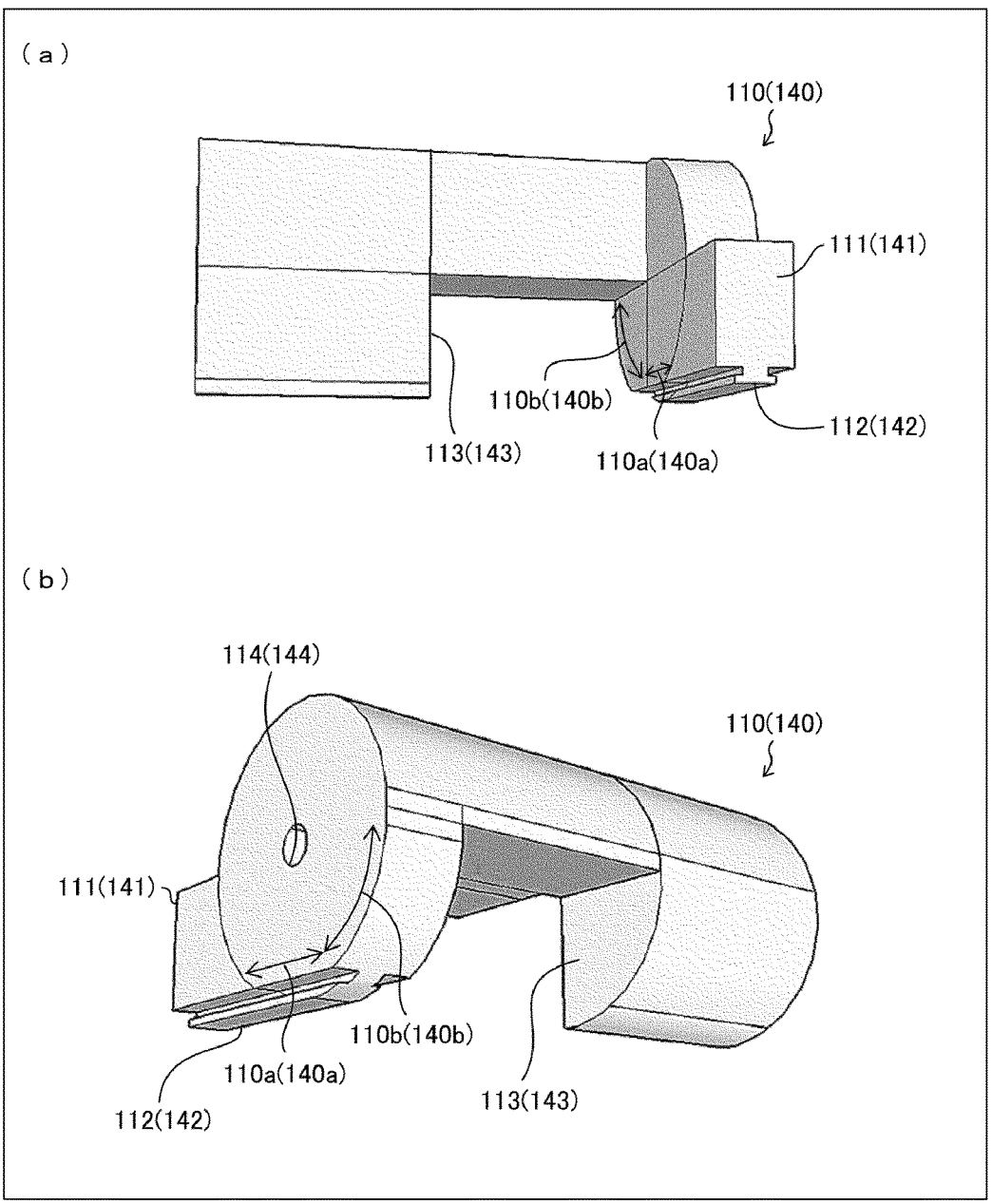

(a) and (b) of FIG. 12 are perspective views each illustrating a schematic configuration of first sliding members of the flexible device in accordance with Embodiment 2 of the present invention, the views showing the first sliding members as viewed from respective different angles.

Figure 13:
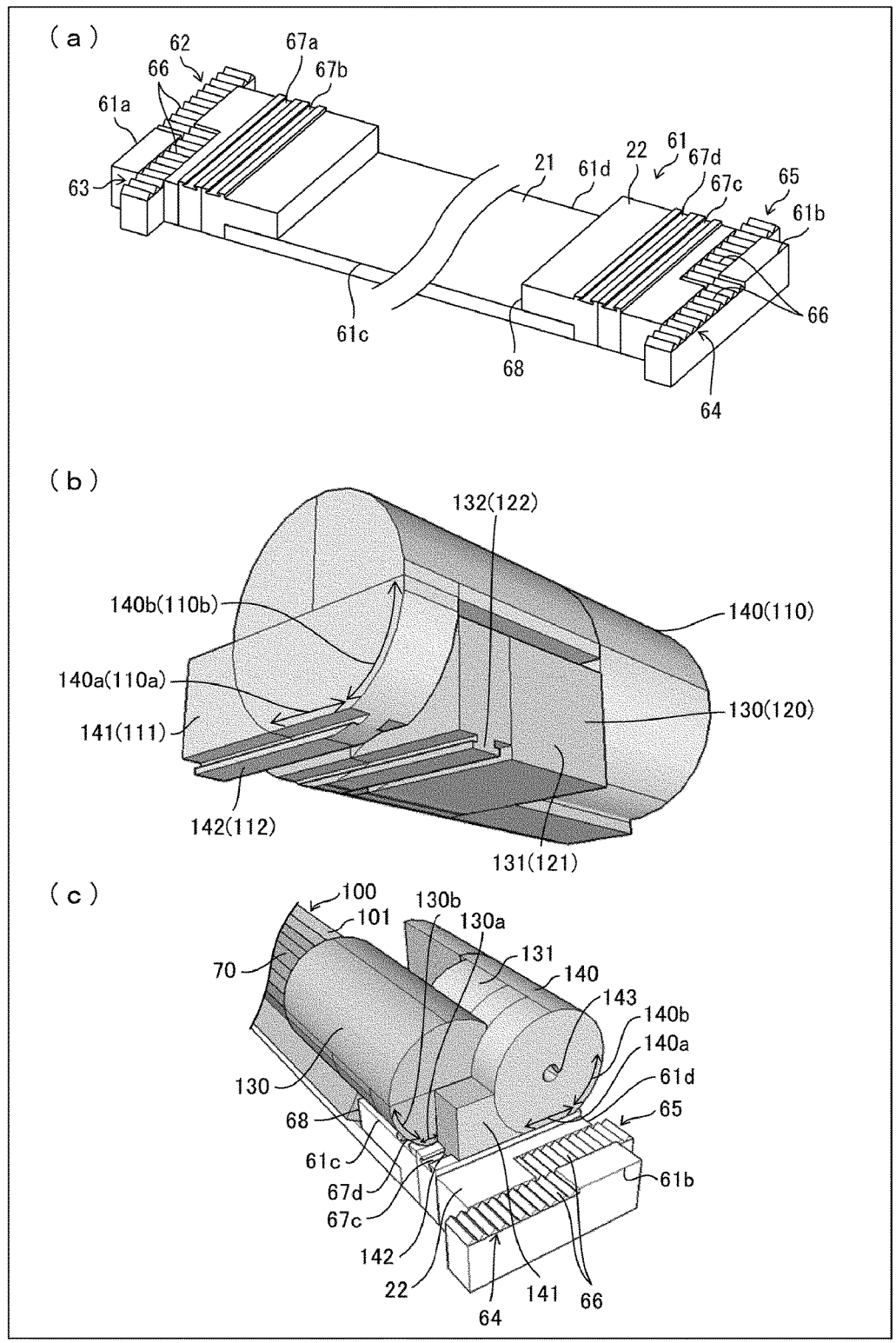

(a) of FIG. 13 is a perspective view illustrating a schematic configuration of a third housing in the flexible device in accordance with Embodiment 2 of the present invention. (b) of FIG. 13 is a perspective view illustrating a state in which the first sliding members are respectively engaged with the second sliding members when the flexible device in accordance with Embodiment 2 of the present invention is folded. (c) of FIG. 13 is a perspective view illustrating a state in which the first sliding members are respectively disengaged from the second sliding members when the flexible device in accordance with Embodiment 2 of the present invention is unfolded.

Figure 14:
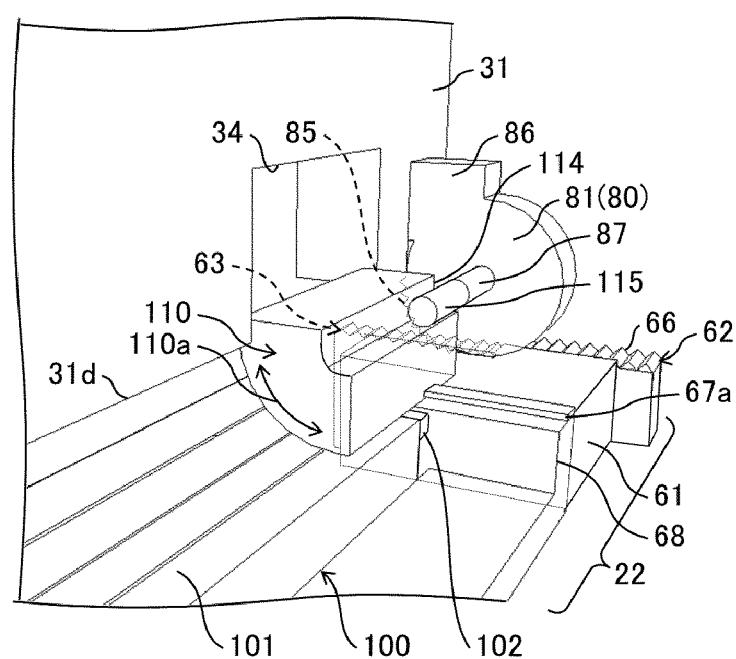

FIG. 14 is another perspective view illustrating a schematic configuration of a main part of the flexible device in accordance with Embodiment 2 of the present invention.

Figure 15:
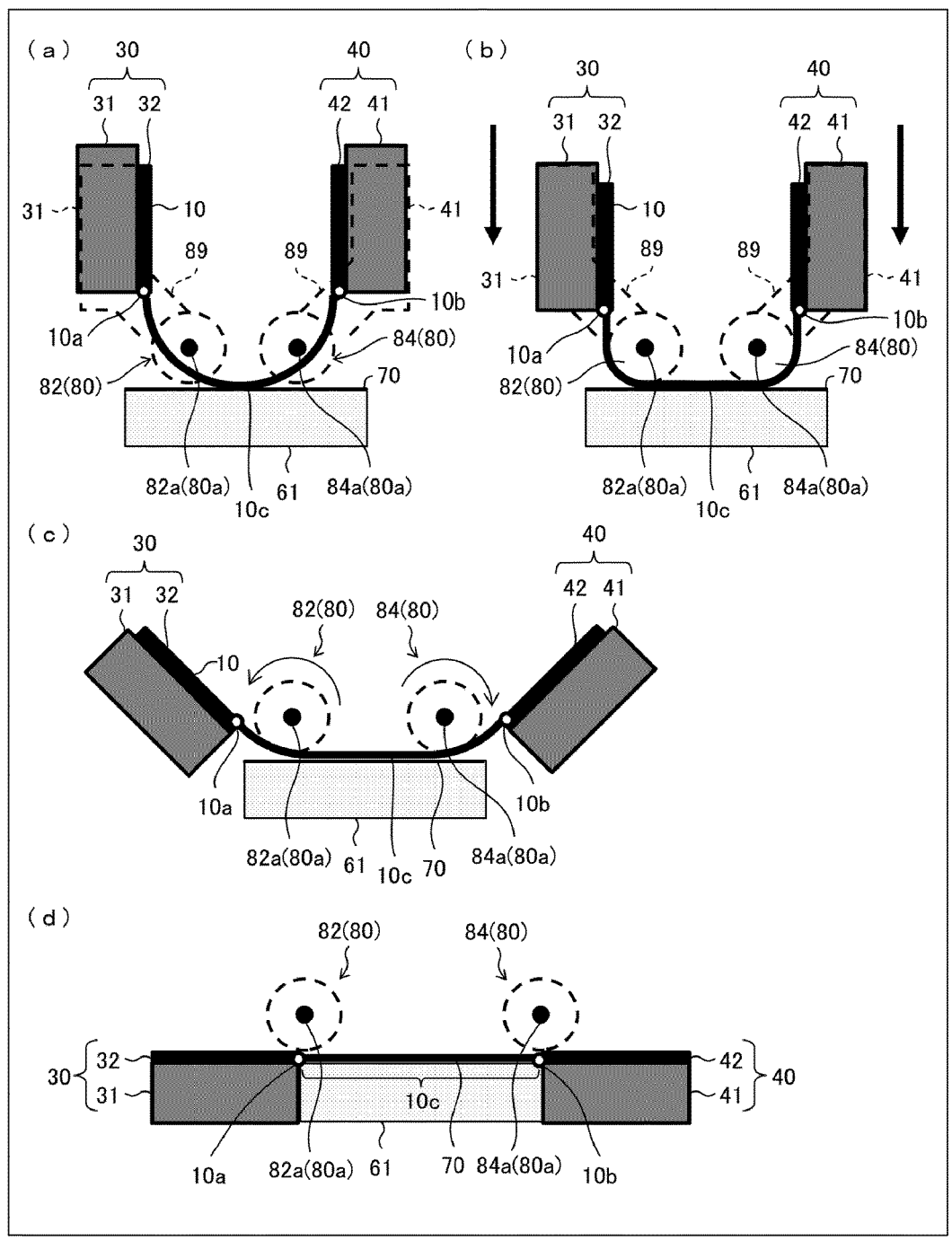

(a) through (d) of FIG. 15 are views each illustrating a schematic configuration of a main part of a flexible device in accordance with Embodiment 3 of the present invention, the views sequentially illustrating a series of states starting from a state in which the flexible device is folded to a state in which the flexible device is unfolded.

Figure 16:
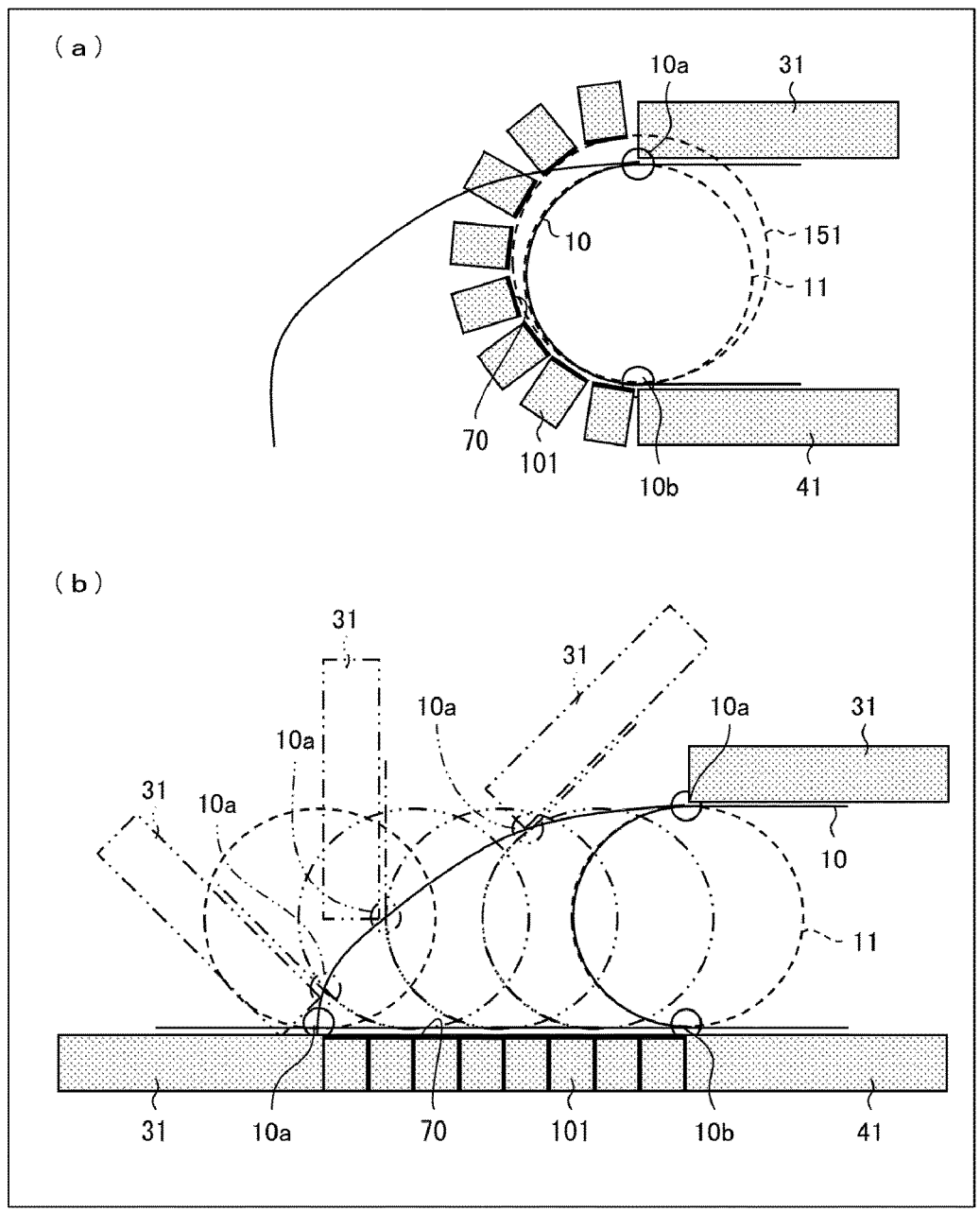

(a) of FIG. 16 is a view illustrating an example of a schematic configuration of a main part of a flexible device in accordance with Modified Example of the present invention in a state where the flexible device is folded, together with a trajectory of transition of a fixed end of a flexible module. (b) of FIG. 16 is a view illustrating how the fixed end of the flexible module makes a transition and how a first housing rolls, between a state in which the flexible device in accordance with Modified Example of the present invention is folded and a state in which the flexible device is unfolded.

Figure 17:
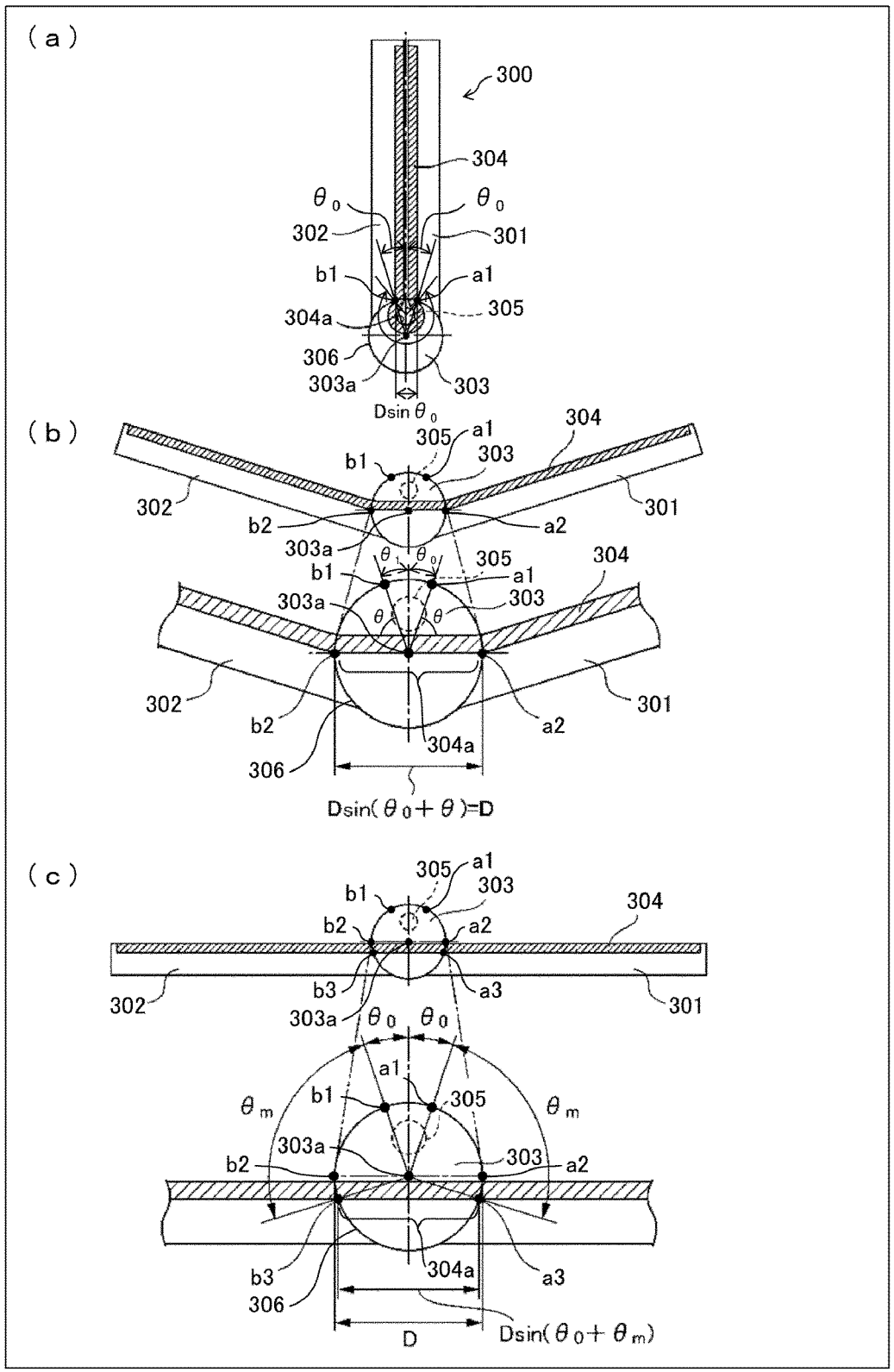

(a) through (c) of FIG. 17 are views each illustrating a schematic configuration of a main part of a display device disclosed in Patent Literature 1. (a) of FIG. 17 is a view illustrating a state in which the display device is folded, the view including an enlarged view of the main part. (b) of FIG. 17 is a view illustrating the display device which is being unfolded, the view including an enlarged view of the main part. (c) of FIG. 17 is a view illustrating a state in which the display device is unfolded, the view including an enlarged view of the main part.

Figure 18:
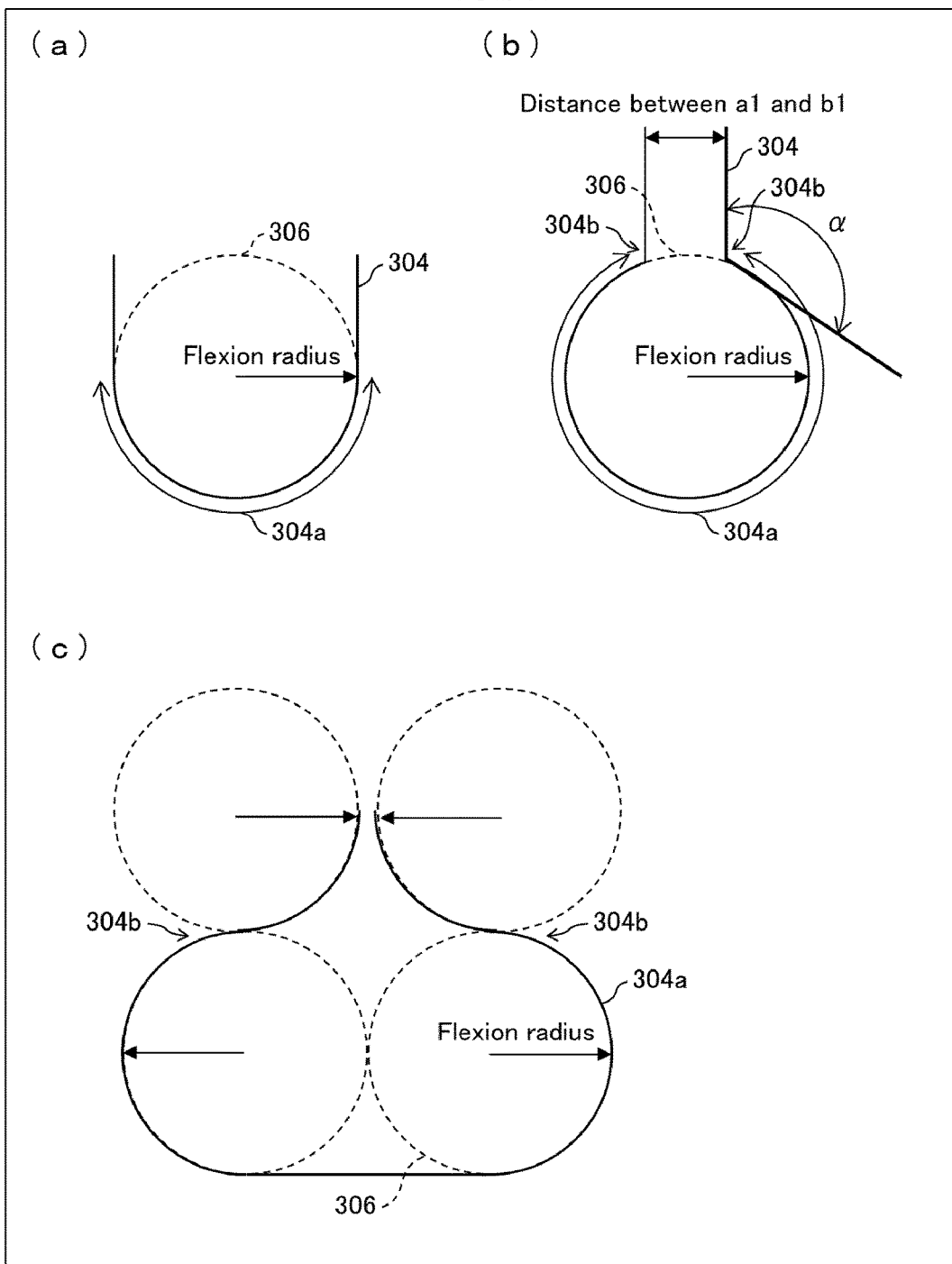

(a) of FIG. 18 is a view schematically illustrating a state of a display panel in Patent Literature 1 in a case where a length of a bent part of the display panel is not more than a half of a flexion circumference. (b) of FIG. 18 is a view schematically illustrating a state of the display panel in Patent Literature 1 in a case where the length of the bent part of the display panel is more than the half of the flexion circumference. (c) of FIG. 18 is a view schematically illustrating the bent part of the display panel in Patent Literature 1 at portions at which the display panel is flexed in an S-shape.

DESCRIPTION OF EMBODIMENTS

The following description will discuss embodiments of the present invention in detail.

Embodiment 1

The following description will discuss an embodiment of the present invention, with reference to (a) through (c) of FIG. 1 through FIG. 5.

Note that in the following description, a flexible organic EL display device will be discussed as an example of a flexible device in accordance with Embodiment 1. Further, the following description will refer to an example case in which the flexible device is bent so that a display surface of the organic EL display panel, which is used as a flexible module, is on an inner side.

Further, unless otherwise particularly mentioned, a state in which the flexible device is open (unfolded) means a state in which the flexible device is unfolded by 180° degrees, i.e., a state in which the flexible device is opened so as to be flat (i.t., so as to be in a so called full-flat position).

<Schematic Configuration of Flexible Device 1>

Figure 1:
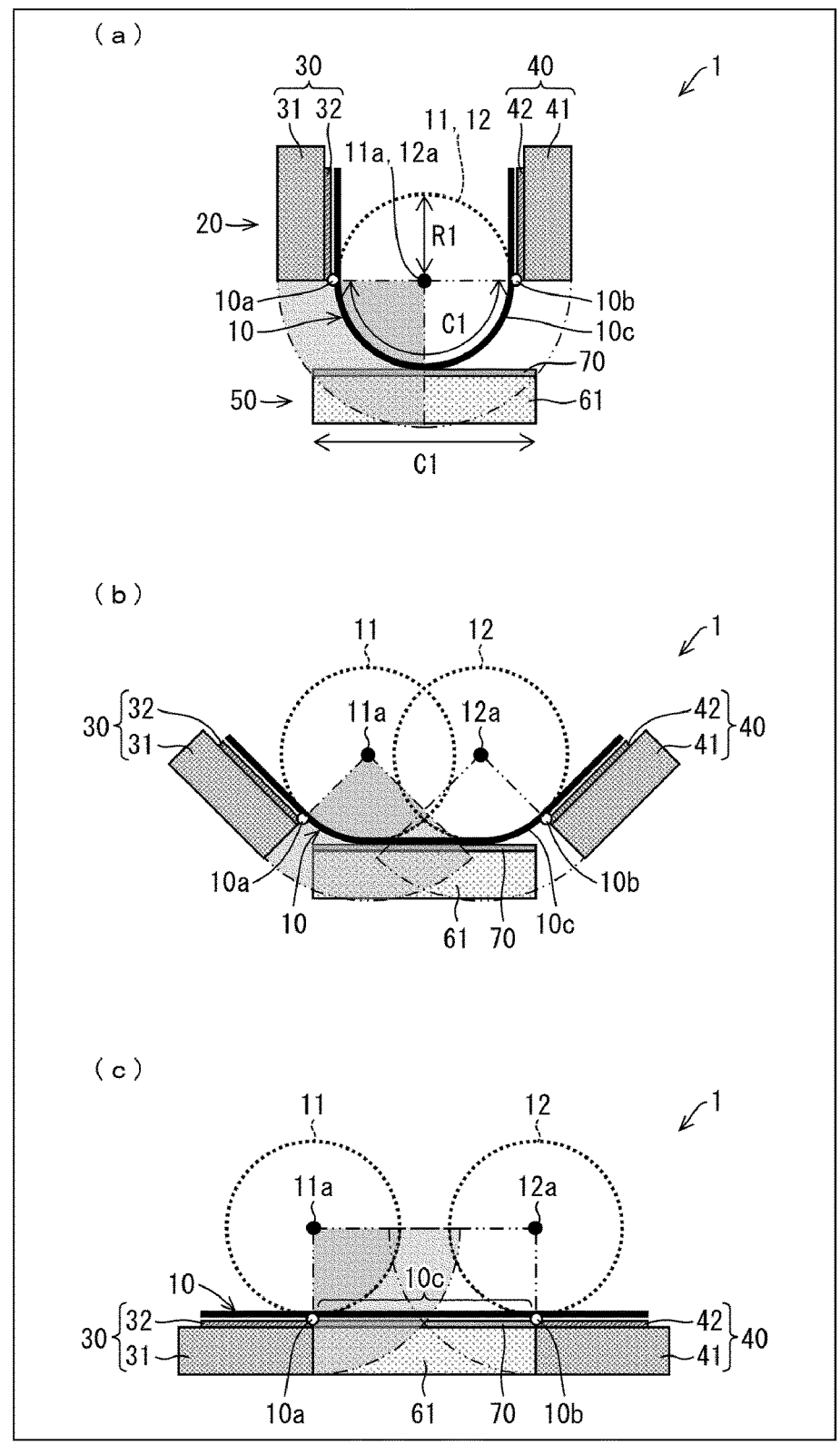
Figure 2:
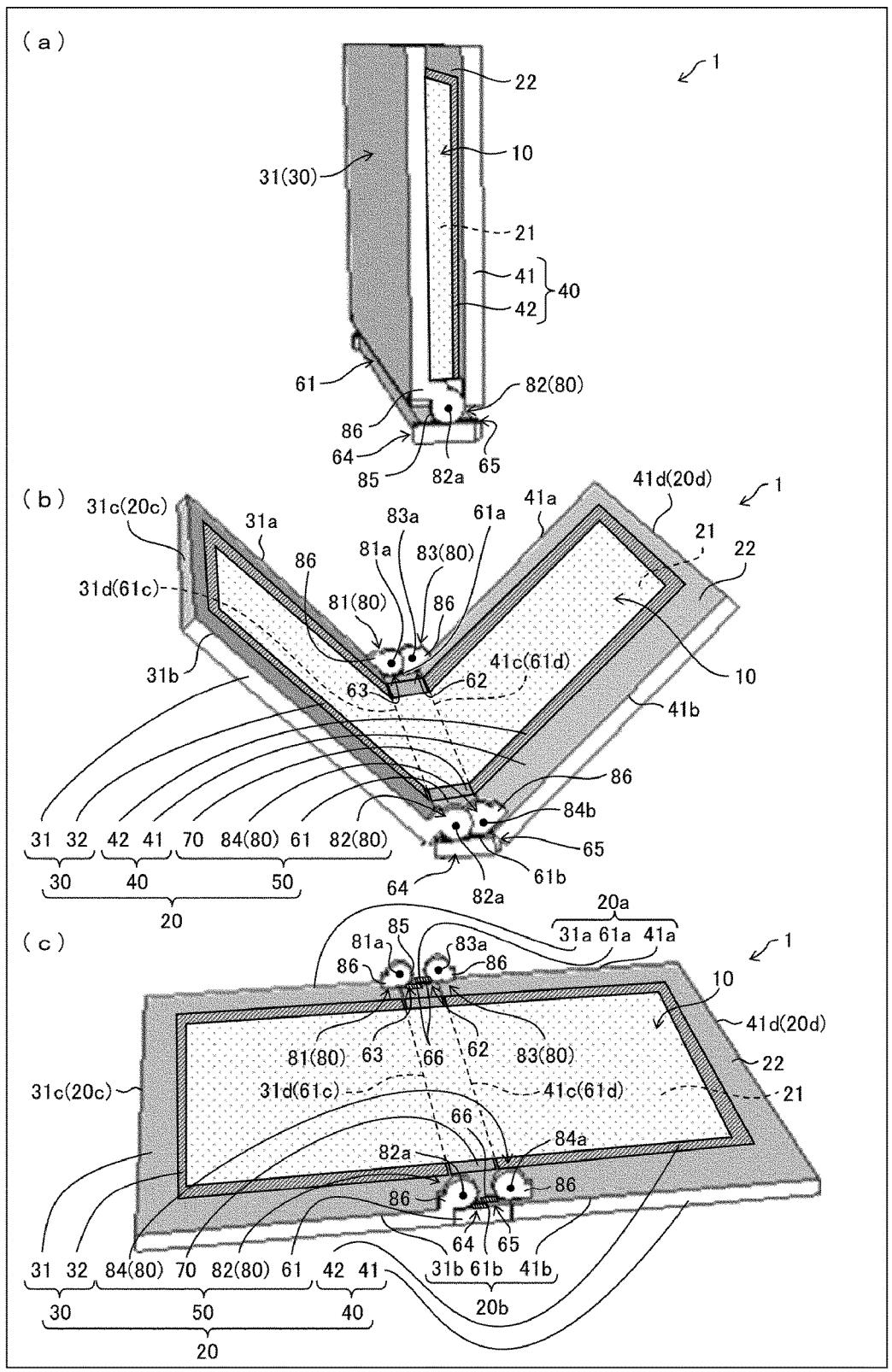
Figure 3:
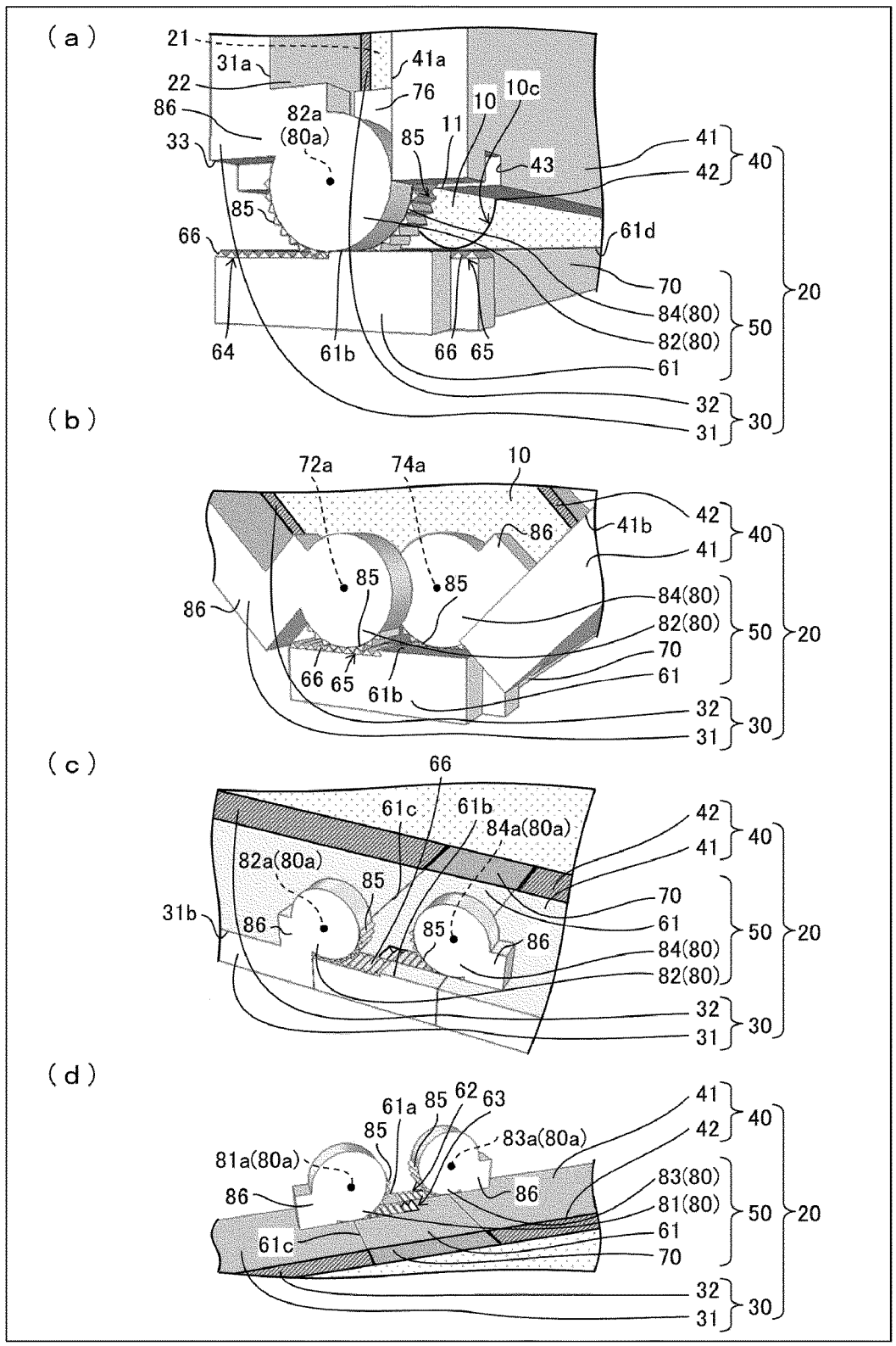
Figure 4:
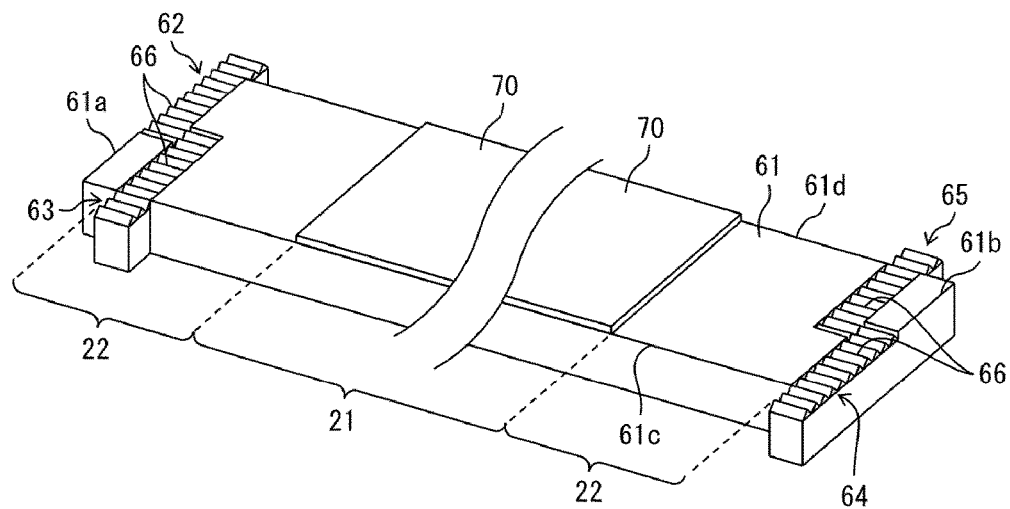
FIG. 4 is a perspective view illustrating a schematic configuration of a main part of a third housing of the flexible device in accordance with Embodiment 1 of the present invention.

(a) through (c) of FIG. 1 are views each schematically illustrating a schematic configuration of a main part of a flexible device 1 in accordance with Embodiment 1, together with turnings of circles 11 and 12 respectively centering around turning axes 11a and 12a of a flexible module 10. (a) through (c) of FIG. 2 are perspective views each schematically illustrating an appearance of a device main body 20 of the flexible device 1 in accordance with Embodiment 1. (a) through (d) of FIG. 3 are perspective views each schematically illustrating a schematic configuration of a main part of the flexible device 1 in accordance with Embodiment 1. Note that (a) of FIG. 1, (a) of FIG. 2, and (a) of FIG. 3 are views each illustrating a state in which the flexible device 1 is folded (bent state). (b) of FIG. 1, (b) of FIG. 2, and (b) of FIG. 3 are views each illustrating the flexible device 1 which is being unfolded or being bent. (c) of FIG. 1, (c) of FIG. 2, and (c) and (d) of FIG. 3 are views each illustrating a state in which the flexible device 1 is unfolded. Further, (a) through (c) of FIG. 3 are views obtained when the flexible device 1 is viewed from a front-surface side of a sheet of each of (a) through (c) of FIG. 2. (d) of FIG. 3 is a view obtained when the flexible device 1 is viewed from a back-surface side of the sheet of each of (a) through (c) of FIG. 2. FIG. 4 is a perspective view illustrating a schematic configuration of a main part of a third housing 61 of the flexible device 1 in accordance with Embodiment 1.

In the following description, a side (i.e., a side of a surface on which the flexible module 10 is fixed to the device main body 20) which is located on an inner side of the flexible device 1 when the flexible device 1 is folded will be referred to as a front side, and a side opposite to the front side will be referred to as a back side.

As illustrated in (a) through (c) of FIG. 1, (a) through (c) of FIG. 2, and (a) through (d) of FIG. 3, the flexible device 1 in accordance with Embodiment 1 is a foldable flexible electronic device which is provided so as to be foldable (flexible) and unfoldable (stretchable) through opening and closing actions. A state of the flexible device 1 is optionally selectable between a folded state (i.e., a closed state) in which the flexible device 1 is folded and an unfolded state (i.e., an open state) in which the flexible device 1 is unfolded.

The flexible device 1 in accordance with Embodiment 1 includes the flexible module 10, the device main body 20 which is a holding body holding the flexible module 10, and a cabinet (not illustrated) which is an outer casing (an exterior cover) covering a side surface and a back surface of the device main body 20.

(Schematic Configuration of Device Main Body 20)

The device main body 20 includes a first housing section 30, a second housing section 40, and a connection section 50. The first housing section 30 and the second housing section 40 face each other when the flexible module 10 is bent. The connection section 50 connects the first housing section 30 and the second housing section 40 to each other so that the first housing section 30 and the second housing section 40 are turnable.

The first housing section 30 includes a first housing 31 and an adhesive layer 32 provided on a front surface of the first housing 31. The second housing section 40 includes a second housing 41 and an adhesive layer 42 provided on a front surface of the second housing 41.

The connection section 50 includes a third housing 61, a slightly-adhesive layer 70 provided on a front surface of the third housing 61, and a plurality of turning bodies 80 each of which is fixed to the first housing 31 or the second housing 41.

Each of the first housing 31, the second housing 41, and the third housing 61 has a quadrangular shape (e.g., a rectangular shape). In particular, the third housing 61 has a belt shape (a strip shape) having short sides 61a and 61b and long sides 61c and 61d. The first housing 31 and the second housing 41 are identical in size.

The first housing 31 and the second housing 41 are disposed so as to face each other across the third housing 61. The first housing 31, the second housing 41, and the third housing 61 are arranged along a direction parallel to the short sides 61a and 61b of the third housing 61 so that (i) the third housing 61 is sandwiched between the first housing 31 and the second housing 41 and (ii) the long sides 61c and 61d of the third housing 61 face the first housing 31 and the second housing 41 respectively.

Note that in each of (a) through (c) of FIG. 1, (a) through (c) of FIG. 2, and (a) through (d) of FIG. 3, the first housing 31 and the second housing 41 are located respectively on a left hand side and a right hand side as viewed from a front-surface side of the sheet, i.e., as viewed from a front.

In Embodiment 1, each of the first housing 31 and the second housing 41 has a rectangular shape, and the first housing 31 is disposed so that a long side 31d, which is one of long sides 31c and 31d of the first housing 31, is adjacent to the long side 61c, which is one of the long sides of the third housing 61. The second housing 41 is disposed so that a long side 41c, which is one of long sides 41c and 41d of the second housing 41, is adjacent to the long side 61d, which is the other of the long sides of the third housing 61.

The device main body 20 has a rectangular shape made up of short sides 20c and 20d and long sides 20a and 20b. The short sides 20c and 20d are respectively the long side 31c of the first housing 31 and the long side 41d of the second housing 41, each of the long side 31c and the long side 41d being located on an opposite side to the third housing 61 when the flexible device 1 is unfolded. The long sides 20a and 20b are respectively (i) a side obtained by connecting a short side 31a of the first housing 31, the short side 61a of the third housing 61, and a short side 41a of the second housing 41 together and (ii) a side obtained by connecting a short side 31b of the first housing 31, the short side 61b of the third housing 61, and a short side 41b of the second housing 41 together.

As illustrated in (a) of FIG. 1, the device main body 20 is configured such that the first housing 31 and the second housing 41 can be folded around the third housing 61 as a center axis so as to sandwich the third housing 61.

When folded, the device main body 20 has a substantially concave shape as viewed in a side view. When the device main body 20 is folded, the third housing 61 forms a bottom wall portion of the concave shape.

Each of the first housing 31, the second housing 41, and the third housing 61 has a shape of flat plate, and is made of a highly rigid material which is conventionally used as a housing of a flexible device. In a state in which the flexible device 1 is unfolded, the front surfaces of the first housing 31, the second housing 41, and the third housing 61 are flush with one another.

The flexible module 10 is provided so as to extend from the first housing 31 to the second housing 41 across the third housing 61.

The first housing 31 and the second housing 41 are connected (joined) by the flexible module 10 and the connection section 50 to the third housing 61 so as to be turnable. The third housing 61 has a structure which is independent of the first housing 31 and the second housing 41 and follows neither turning of the first housing 31 nor turning of the second housing 41.

As illustrated in (a) of FIG. 1, (a) of FIG. 2, and (a) of FIG. 3, in a state where the flexible device 1 is folded, portions of a front surface of the flexible module 10, which is laid on the first housing 31 and the second housing 41, face each other while being spaced apart from each other. A size of a gap between the portions of the front surface of the flexible module 10 thus folded in two is determined with reference to a limit flexion radius of the flexible module 10. Further, on the basis of a flexion radius R1 (see (a) of FIG. 1), which is determined on the basis of the limit flexion radius in consideration of a margin, of the flexible module 10, a length C1 (see (a) of FIG. 1) of a bent part 10c of the flexible module 10 is determined.

Since the portions of the front surface of the flexible module 10 thus face each other while being spaced apart from each other in a state where the flexible device 1 is folded, the portions of the front surface of the flexible module 10 do not abut on each other. This allows preventing the front surface of the flexible module 10, a circuit (not illustrate), and the like from becoming impaired.

As illustrated in (a) through (c) of FIG. 2 and (a) through (d) of FIG. 3, the flexible module 10 has a rectangular shape smaller than the device main body 20. Accordingly, the front surfaces of the device main body 20 include a flexible module-provided region 21 and a frame region 22. In a state in which the flexible device 1 is unfolded, the frame region 22 surrounds the flexible module-provided region 21 which is obtained by connecting regions of the first housing 31, the second housing 41, and the third housing 61 which regions each constitute part of the flexible module-provided region 21.

In the frame region 22 on a front surface side of the first housing 31 and in the frame region 22 on a front surface side of the second housing 41, the plurality of turning bodies 80 are respectively provided.

In Embodiment 1, as the plurality of turning bodies 80, first turning bodies 81 and 82 are fixed to the first housing 31 and second turning bodies 83 and 84 are fixed to the second housing 41. Note that in a case where it is unnecessary to distinguish between the first turning bodies 81 and 82 and the second turning bodies 83 and 84, the first turning bodies 81 and 82 and the second turning bodies 83 and 84 are all referred to as turning bodies 80, and turning axes 81a, 82a, 83a, and 84a (centers of turning) of the first turning bodies 81 and 82 and the second turning bodies 83 and 84 are all referred to as turning axes 80a.

The first turning bodies 81 and 82 are fixed to the frame region 22 of the first housing 31, and the second turning bodies 83 and 84 are fixed to the frame region 22 of the second housing 41.

In Embodiment 1, the first turning bodies 81 and 82 are each fixed to the vicinity of a boundary, with respect to the third housing 61, of a corresponding one of portions of the frame region 22 of the first housing 31 which portions sandwich the flexible module 10. The first turning bodies 81 and 82 face the third housing 61.

Meanwhile, the second turning bodies 83 and 84 are each fixed to the vicinity of a boundary, with respect to the third housing 61, of a corresponding one of portions of the frame region 22 of the second housing 41 which portions sandwich the flexible module 10. The second turning bodies 83 and 84 face the third housing 61.

The short sides 61a and 61b, which face neither the first housing 31 nor the second housing 41, of the third housing 61 constitute part (specifically, parts of the respective long sides 20a and 20b of the device main body 20) of an outer edge part of the device main body 20.

As illustrated in (a) through (c) of FIG. 2, (a) through (d) of FIG. 3, and FIG. 4, the third housing 61 includes racks 62 and 63 and racks 64 and 65 in the frame region 22 of the third housing 61. The racks 62 and 63 are provided along and parallel to one short side 61a in two lines so as to form a staggered zigzag shape. The racks 64 and 65 are provided along and parallel to the other short side 61b in two lines so as to form a staggered zigzag shape.

The racks 62 and 63 are provided along the short side 61a, which is on a back-surface side of the sheet of each of (a) through (c) of FIG. 2 and FIG. 4. The racks 64 and 65 are provided along the short side 61b, which is on a front-surface side (a front side) of the sheet of each of (a) through (c) of FIG. 2.

The rack 62 extends from a boundary of the third housing 61 with respect to the second housing 41 to a widthwise central part of the third housing 61 in a direction perpendicular to the turning axis 80a of a corresponding one of the turning bodies 80. Specifically, rack 62 extends along the one short side 61a, which is parallel to a direction in which the housings (the first housing 31, the third housing 61, and the second housing 41) are arranged. The rack 63 extends parallel to the one short side 61a from a boundary of the third housing 61 with respect to the first housing 31 to the widthwise central part of the third housing 61 so that a tip part of the rack 63 is adjacent to a tip part of the rack 63.

The rack 64 extends from the boundary of the third housing 61 with respect to the first housing 31 to the widthwise central part of the third housing 61 in the direction perpendicular to the turning axis 80a of a corresponding one of the turning bodies 80. Specifically, rack 64 extends along the other short side 61b, which is parallel to the direction in which the housings (the first housing 31, the third housing 61, and the second housing 41) are arranged. The rack 65 extends parallel to the other short side 61b from the boundary of the third housing 61 with respect to the second housing 41 to the widthwise central part of the third housing 61 so that a tip part of the rack 65 is adjacent to a tip part of the rack 64.

Each of the racks 62 through 65 includes a plurality of teeth 66 which are formed parallel to the turning axis 80a of a corresponding one of the turning bodies 80.

Each turning body 80 is a pinion (a pinion gear). Part of each turning body 80 includes a plurality of teeth 85 which are provided parallel to the turning axis 80a of the each turning body 80 and engage with the teeth 66 of a corresponding one of the racks 62 through 65.

As illustrated in (a) and (b) of FIG. 3 and FIG. 4, the racks 62 through 65 each protrude toward the first housing 31 or the second housing 41 so that the teeth 66 of each of the racks 62 through 65 engage with a corresponding one of (i) the teeth 85 of one of the first turning bodies 81 and 82 fixed to the vicinity of a boundary of the first housing 31 with respect to the third housing 61 and (ii) the teeth 85 of one of the second turning bodies 83 and 84 fixed to the vicinity of a boundary of the second housing 41 with respect to the third housing 61. That is, as illustrated in (c) and (d) of FIG. 3, the racks 62 through 65 each protrude toward the first housing 31 or the second housing 41 up to a position which comes in contact with a corresponding one of the first turning bodies 81 and 82 and the second turning bodies 83 and 84 when the flexible device 1 is unfolded.

Accordingly, as illustrated in (a) of FIG. 3, the first housing 31 includes a notch part 33 with which the rack 64 engages when the flexible device 1 is unfolded, and the second housing 41 includes a notch part 43 with which the rack 65 engages when the flexible device 1 is unfolded. Further, the first housing 31 includes a notch part (not illustrated) with which the rack 63 engages when the flexible device 1 is unfolded, and the second housing 41 includes a notch part (not illustrated) with which the rack 62 engages when the flexible device 1 is unfolded.

The notch part which is provided in the first housing 31 and with which the rack 63 engages when the flexible device 1 is unfolded has a shape identical to that of the notch part 43 which is provided in the second housing 41 and with which the rack 65 engages when the flexible device 1 is unfolded. The notch part 43 which is provided in the second housing 41 and with which the rack 62 engages when the flexible device 1 is unfolded has a shape identical to that of the notch part 33 which is provided in the first housing 31 and with which the rack 64 engages when the flexible device 1 is unfolded.

In Embodiment 1, as described above, the rack 62 and the rack 63 are provided so as to be shifted from each other in a longitudinal direction of the third housing 61 (i.e., so as to be in two lines), and the rack 64 and the rack 65 are provided so as to be shifted from each other in the longitudinal direction of the third housing 61. As a result, when the flexible device 1 is folded, (i) the first turning body 81 and the second turning body 83 overlap with each other in the longitudinal direction of the third housing 61 so that the turning axes 81a and 83a of the respective first and second turning bodies 81 and 83 overlap with each other on the same axis (i.e., on a single straight line), and the first turning body 82 and the second turning body 84 overlap with each other in the longitudinal direction of the third housing 61 so that the turning axes 82a and 84a of the respective first and second turning bodies 82 and 84 overlap with each other on the same axis (i.e., on a single straight line).

A fixation part 86, which is fixed to the first housing 31 or the second housing 41, of each turning body 80 is provided in a portion which is not provided with the teeth 75. In Embodiment 1, as described above, when the flexible device 1 is folded, the first turning body 81 and the second turning body 83 overlap with each other and the first turning body 82 and the second turning body 84 overlap with each other in the longitudinal direction of the third housing 61. As such, the fixation part 86 is provided on a circumferential surface of each turning body 80.

Each turning body 80 turns on a corresponding one of the racks 62 through 65 in accordance with turnings of the first housing 31 and the second housing 41 as the flexible device 1 is unfolded or folded. When turnings of the first housing 31 and the second housing 41 causes a turning force (a rotating force) to be applied to each turning body 80, the turning axis 80a of the each turning body 80 moves in a horizontal direction to an end of a corresponding one of the racks 62 through 65 on which the teeth 66 are provided. This causes a turning motion of each turning body 80 to be converted into a linear motion of the turning axis 80a of the each turning body 80, so that the turning axis 80a of the each turning body 80 makes a transition in the horizontal direction (a horizontal movement).

Note that a pitch at which the teeth 85 of each turning body 80 are arranged and a pitch at which the teeth 66 of each of the racks 62 through 65 are arranged are not particularly limited, provided that the pitches are identical to each other so that the teeth 85 and the teeth 66 engage with each other.

Further, a material of each turning body 80 and a material of each of the racks 62 through 65 are not particularly limited either. The racks 62 through 65 may be part of the third housing 61, or attached to the third housing 61. Accordingly, the material of each of the racks 62 through 65 may be the same as or different from that of the third housing 61.

In a case where the teeth 85 of each turning body 80 and the teeth 66 of each of the racks 62 through 65 are each made of a metal, an increase in strength and a resultant improvement in durability are achieved. In a case where the teeth 85 of each turning body 80 and the teeth 66 of each of the racks 62 through 65 are each made of a resin, a reduction in frictional resistance, inexpensive and easy molding, and a reduction in size are achieved.

In the flexible module-provided region 21 on the front surface side of the first housing 31, the adhesive layer 32 is provided. In the flexible module-provided region 21 on the front surface side of the second housing 41, the adhesive layer 42 is provided. In the flexible module-provided region 21 on the front surface side of the third housing 61, the slightly-adhesive layer 70 is provided.

The adhesive layer 32 is a fixation part at which the flexible module 10 is fixed to the first housing 31. The adhesive layer 42 is a fixation part at which the flexible module 10 is fixed to the second housing 41. The flexible module 10 is fixed by the adhesive layers 32 and 42 to the first housing 31 and the second housing 41.

As the adhesive layers 32 and 42, a well-known adhesive, adhesive sheet, or the like which is generally used for bonding a housing and a flexible module to each other can be used.

Meanwhile, the slightly-adhesive layer 70 is a slightly-adhesive part (a contact part) which causes the flexible module 10 to be peelably bonded (adhered or adsorbed) to the third housing 61, so that an area of contact (area of bonding) between the slightly-adhesive layer 70 and the flexible module 10 changes in accordance with turnings of the first housing 31 and the second housing 41.

By thus causing the flexible module 10 to be peelably bonded (adhered or adsorbed) to the third housing 61, the slightly-adhesive layer 70 supports the flexible module 10 from a back side of the flexible module 10 when the flexible device 1 is folded and unfolded. This prevents the flexible module 10 from being lifted off the third housing 61.

As the slightly-adhesive layer 70, a slightly-adhesive adhesive having slight adhesion or slight adsorptivity (i.e., a slightly-adherent tackifier, a slightly-adsorptive adsorbent) or a slightly-adhesive sheet (i.e., slightly-adherent sheet, a slightly-adsorptive sheet) can be used. The slightly-adhesive adhesive or the slightly-adhesive sheet is an easily-peelable adhesive or an easily-peelable sheet.

The slightly-adhesive layer 70 only needs to be able to allow the area of contact between the slightly-adhesive layer 70 and the flexible module 10 to change in accordance with turnings of the first housing 31 and the second housing 41. Thus, the slightly-adhesive layer 70 only needs to have such a level of adhesiveness (adhesion or adsorptivity).

The adhesiveness (adhesion or adsorptivity) which is required of the slightly-adhesive layer 70 in accordance with Embodiment 1 is represented by peel force and shearing force. The peel force and the shearing force for the slightly-adhesive layer 70 is not particularly limited, and can be set as appropriate in accordance with, for example, a thickness and a material of the flexible module 10. For example, the peel force is preferably about or not more than 23 gf/25 mm, and the shearing force is preferably about or not less than 1.4 gf/cm$^2$.

The slightly-adhesive layer 70 is not particularly limited, but may be, for example, "FIXFILM (registered trademark)" manufactured by FUJICOPIAN CO., LTD.

The slightly-adhesive layer 70 having slight adhesion or slight adsorptivity exhibits a relatively strong adhesive power or adsorption power to a bonded object with respect to the horizontal direction. Meanwhile, the slightly-adhesive layer 70 exhibits a very weak adhesive power or adsorption power against a force applied to a bonded object when the bonded object is peeled from an end of the slightly-adhesive layer 70.

Accordingly, as illustrated in (a) through (c) of FIG. 1, the flexible module 10 (i) is peeled from an end of the slightly-adhesive layer 70 on a side of the boundary of the third housing 61 with respect to each of the first housing 31 and the second housing 41, in accordance with a folding action of the flexible device 1 and (ii) is bonded (adhered or adsorbed) to the slightly-adhesive layer 70 in accordance with an unfolding action of the flexible device 1.

(Schematic Configuration of Flexible Module 10)

As mentioned above, in Embodiment 1, an organic EL display device is discussed as an example of the flexible device 1. Accordingly, an organic EL display panel is used as the flexible module 10.

Note that the flexible device 1 in accordance with Embodiment 1 is not limited to the organic EL display device, and may be (i) a display device of other display methods, such as an inorganic EL display device, a liquid crystal display device, or the like, (ii) an electrophoresis device, and (iii) a bendable flexible device other than a display device, such as a light-emitting device such as an LED illumination device.

Accordingly, the flexible module 10 may be (i) a flexible display such as an inorganic EL display panel or a liquid crystal display panel, (ii) a flexible printed circuit board which is not provided with a display element, and (iii) the like.

In Embodiment 1, as an example of the flexible module 10, an organic EL display panel having a screen size of 8 inches (approximately 10 cm×18 cm) and a panel thickness of approximately 150 µm was used.

In Embodiment 1, as an example, the flexible module 10 was fixed to the first housing 31 and the second housing 41 with use of adhesive layers 32 and 42 each having a thickness of 25 µm, and a slightly-adhesive layer 70 having a thickness of 25 µm was formed by subjecting the flexible module-provided region 21 on the front surface side of the third housing 61 to a treatment for making the flexible module-provided region 21 slightly adhesive.

<Transitions of Turning Axes and Fixed Ends of Flexible Module 10>

The flexible device 1 is carried around by a user in a state in which the flexible device 1 is folded so as to be closed (i.e., a state in which the first housing 31 and the second housing 41 face each other). The flexible device 1 is used by a user in a state where the flexible device 1 is opened so that, for example, the first housing 31 and the second housing 41 are unfolded so as to be on a single plane (an unfolded state).

Figure 5:
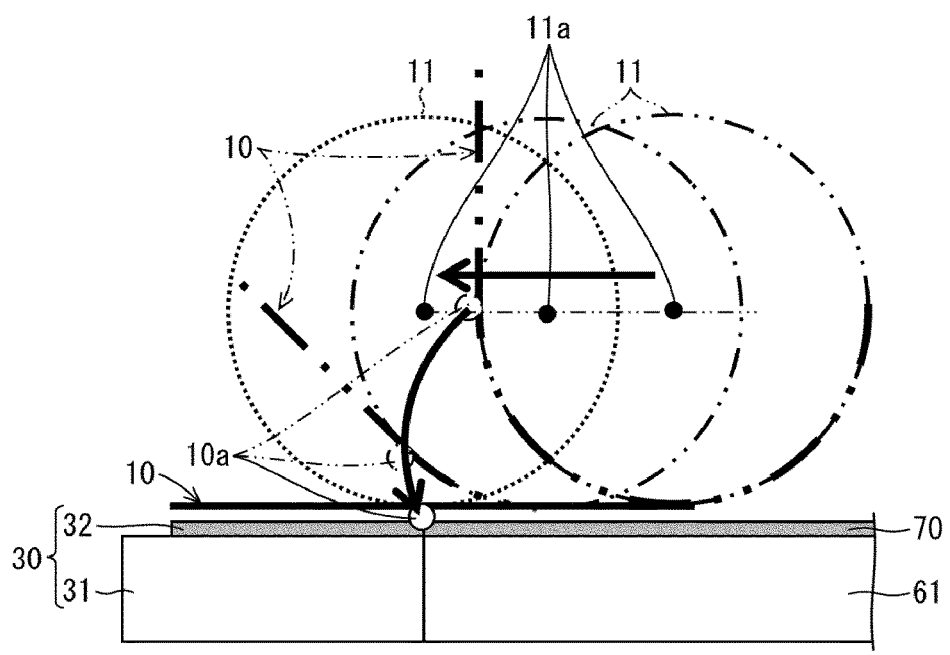
FIG. 5 is a cross-sectional view of a main part of the flexible device in accordance with Embodiment 1 of the present invention.

The following description will discuss, with reference to (a) through (c) of FIG. 1 and FIG. 5, transitions of the turning axes and fixed ends of the flexible module 10 in accordance with an opening and closing operation of the flexible device 1.

FIG. 5 is a cross-sectional view of a main part of the flexible device 1, the view schematically illustrating, together with turning of the circle 11 around the turning axis 11a, as a center point, of the flexible module 10 in accordance with Embodiment, (i) a transition of the turning axis 11a toward the first housing 31 and (ii) a transition of a fixed end 10a, which is fixed to the first housing 31, of the flexible module 10.

For convenience, illustrations of the first housing 31 and the second housing 41 in a state in which the flexible device 1 is folded and while the flexible device 1 is being unfolded are omitted in FIG. 5.

As described above, the first housing 31 and the second housing 41 are connected, by the flexible module 10 and the connection section 50, to the third housing 61 so as to be turnable. As illustrated in (a) through (c) of FIG. 1, in a view in which the flexible module 10 in a folded state is divided into a left half and a right half along the turning axes 11a and 12a of the flexible module 10, (i) transitions of the turning axes 11a and 12a of the flexible module 10 are in a plane-symmetrical relationship with each other and (ii) a transition of the fixed end 10a, which is fixed to the first housing 31, and a transition of the fixed end 10b, which is fixed to the second housing 41, are in a plane-symmetrical relationship with each other. As such, illustrations of a transition of the turning axis 12a of the flexible module 10 toward the second housing 41 and a transition of the fixed end 10b, which is fixed to the second housing 41, of the flexible module 10 are omitted in FIG. 5.

The circle 11, which is indicated with dotted lines in (a) through (c) of FIG. 1 and FIG. 5, is a circle which (i) centers around the turning axis 11a (i.e., the turning axis of the first housing 31) of the flexible module 10 turning in accordance with turning of the first housing 31 and (ii) includes part of the flexible module 10 as part of an arc of the circle. The circle 12, which is indicated with dotted lines in (a) through (c) of FIG. 1 and FIG. 5, is a circle which (i) centers around the turning axis 12a (i.e., the turning axis of the second housing 41) of the flexible module 10 turning in accordance with turning of the second housing 41 and (ii) includes part of the flexible module 10 as part of an arc of the circle.

The turning axis 11a coincides with the turning axes 81a and 82a of the first turning bodies 81 and 82 fixed to the first housing 31. The circle 11 coincides with circles centering around the respective turning axes 81a and 82a, i.e., coincides with a shape of an outer periphery of each of the first turning bodies 81 and 82 excluding the fixation part 86 fixed to the first housing 31. The turning axis 12a coincides with the turning axes 83a and 84a of the second turning bodies 83 and 84 fixed to the second housing 41, and the circle 12 coincides with circles respectively centering around the turning axes 83a and 84a, that is, coincides with a shape of an outer periphery of each of the second turning bodies 83 and 84 excluding the fixation part 86 fixed to the first housing 41.

R1 in (a) of FIG. 1 represents a radius of each of the circles 11 and 12. R1 is equal to a radius of each of the first turning bodies 81 and 82 and the second turning bodies 83 and 84.

C1 in (a) of FIG. 1 represents a length of a 180° arc of the bent part of the flexible module 10 when the flexible device 1 is folded (bent). C1 is equal to a length of the bent part 10c of the flexible module 10 between the fixed end 10a, which is fixed to the first housing 31, of the flexible module 10 and the fixed end 10b, which is fixed to the second housing 41, of the flexible module 10.

Note here that the fixed end 10a, which is fixed to the first housing 31, of the flexible module 10 means a point at which the flexible module 10 is fixed at the boundary of the first housing 31 with respect to the third housing 61. The fixed end 10b, which is fixed to the second housing 41, of the flexible module 10 means a point at which the flexible module 10 is fixed at the boundary of the second housing 41 with respect to the third housing 61.

The flexible module 10 is bent between the fixed ends 10a and 10b when the flexible device 1 is folded. That is, a portion between the fixed ends 10a and 10b is the bent part 10c of the flexible module 10.

Embodiment 1 employs an example case in which R1=3 mm. Accordingly, C1 is equivalent to a length of an arc with an arc angle of 180° on a circle with a radius of 3 mm. Since a length of an arc is determined by $2\pi r \times (\text{arc angle}/360)$, C1 is approximately 9.4 mm.

Advantageous Effects

According to Embodiment 1, as illustrated in (a) through (c) of FIG. 1 and FIG. 5, a flexing action and a stretching action of the flexible module 10 are carried out in such a manner that a position of the turning axis 80a of each turning body 80 and a turning angle act in conjunction with each other. According to Embodiment 1, as illustrated in (a) through (c) of FIG. 1 and FIG. 5, the turning axis 80a of each turning body 80 rolling on the third housing 61, which is disposed so as to face the bent part 10c of the flexible module 10, moves (makes a transition) in the horizontal direction in accordance with turnings of the first housing 31 and the second housing 41. Accordingly, in contrast to a case in which a turning axis is fixed as in Patent Literature 1, the bent part 10c of the flexible module 10 does not become twisted or distorted. This enables an improvement in reliability of the flexible device 1 over conventional technology.

Further, the flexible device 1 includes the slightly-adhesive layer 70, which has slight adhesion or slight adsorptivity (i.e., weak adhesion or adsorptivity), on a surface of the third housing 61 which surface comes in contact with the flexible module 10. As such, according to Embodiment 1, in a stretching action of the flexible module 10, the flexible module 10 comes in close contact with the slightly-adhesive layer 70 from a part (a central part of the slightly-adhesive layer 70 in a direction in which the flexible module 10 stretches) of the slightly-adhesive layer 70 so that an area of contact continuously increases. A region of close contact between the slightly-adhesive layer 70 in accordance with Embodiment and the flexible module 10 increases in accordance with a stretching action of the flexible module 10, and decreases in accordance with a flexing action of the flexible module 10.

Thus, according to Embodiment 1, the area of contact between the flexible module 10 and the slightly-adhesive layer 70 continuously changes in accordance with turnings of the first housing 31 and the second housing 41. As a result, according to Embodiment 1, the bent part 10c of the flexible module 10 is in contact with the slightly-adhesive layer 70 (i.e., is in a fixed state) during opening and closing actions performed by folding and unfolding of the flexible device 1. This allows preventing the flexible module 10 from being lifted in a direction perpendicular to the flexible module 10 and from being shifted in a planar direction of the flexible module 10. This accordingly allows preventing the flexible module 10 from having a crease, a twist, and a distortion when the flexible module 10 is unfolded (stretched) or folded. Accordingly, it becomes possible to suppress degradation in operability in a touching operation and the like and degradation in visibility such as display quality.

Further, according to Embodiment 1, as described above, since the position of the turning axis 80a of the turning body 80 and the turning angle of the turning body 80 act in conjunction with each other, the flexible module 10 can be gradually brought into close contact with or gradually peeled from the slightly-adhesive layer 70, and since the turning axis 80a of the turning body 80 moves horizontally, the flexible module 10 can be attached to and detached from the slightly-adhesive layer 70 without stress on the flexible module 10. Thus, Embodiment 1 enables a configuration according to which stress-free attachment and detachment of the flexible module 10 is possible, and once the flexible module 10 is weakly bonded to the slightly-adhesive layer 70, the flexible module 10 is unlikely to be shifted in the planar direction. According to Embodiment 1, these configurations allow ensuring both (i) flexibility of the flexible module 10 and (ii) quality and reliability during operation.

Embodiment 2

The following will describe Embodiment 2 of the present invention with reference to (a) through (c) of FIG. 6 through FIG. 14. Note that Embodiment 2 will describe differences from Embodiment 1. The same reference signs are given to members having functions identical to those of members described in Embodiment 1, and descriptions of such members are therefore omitted.

<Schematic Configuration of Flexible Device 1>

(a) through (c) of FIG. 6 are views each schematically illustrating a schematic configuration of a main part of a flexible device 1 in accordance with Embodiment 2, together with turnings of circles 11 and 12 centering around respective turning axes 11a and 12a of a flexible module 10 as well as turnings of circles 151 and 152 centering around respective engaging protrusions which are connected respectively to a first sliding member and a second sliding member. (a) of FIG. 6 is a view illustrating a state in which the flexible device 1 is folded (bent state). (b) of FIG. 6 is a view illustrating the flexible device 1 which is being unfolded or being bent. (c) of FIG. 6 is a view illustrating a state in which the flexible device 1 is unfolded.

FIG. 7 is a view schematically illustrating how a plurality of back surface supporting members 101 move along a first sliding member 140 and a second sliding member 130. (a) through (c) of FIG. 8 are perspective views each illustrating a schematic configuration of a main part of the flexible device 1 in a state in which the flexible device 1 is folded, the views showing the main part as viewed from respective different angles. (a) through (d) of FIG. 9 are perspective views each illustrating a schematic configuration of a main part of the flexible device 1 in a state in which the flexible device 1 is unfolded (stretched) by 90°, the views showing the main part as viewed from respective different angles. (a) through (d) of FIG. 10 are perspective views each illustrating a schematic configuration of a main part of the flexible device 1 in a state in which the flexible device 1 is unfolded (stretched) by 180°, the views showing the main part as viewed from respective different angles.

(a) and (b) of FIG. 11 are perspective views each illustrating a schematic configuration of a second sliding member 120 and the second sliding member 130 of the flexible device 1 in accordance with Embodiment 2, the views showing the second sliding member 120 and the second sliding member 130 as viewed from respective different angles. (a) and (b) of FIG. 12 are perspective views each illustrating a schematic configuration of a first sliding member 110 and the first sliding member 140 of the flexible device 1 in accordance with Embodiment 2, the views showing the first sliding member 110 and the first sliding member 140 as viewed from respective different angles.

(a) of FIG. 13 is a perspective view illustrating a schematic configuration of a third housing 61 in the flexible device 1 in accordance with Embodiment 2. (b) of FIG. 13 is a perspective view illustrating a state in which the first sliding members 110 and 140 are respectively engaged with the second sliding members 120 and 130 when the flexible device 1 in accordance with Embodiment 2 is folded. (c) of FIG. 13 is a perspective view illustrating a state in which the first sliding members 110 and 140 are respectively disengaged from the second sliding members 120 and 130 when the flexible device 1 in accordance with Embodiment 2 is unfolded. FIG. 14 is another perspective view illustrating a schematic configuration of a main part of the flexible device 1 in accordance with Embodiment 2.

The flexible device 1 in accordance with Embodiment 2 is identical to the flexible device 1 in accordance with Embodiment 1 except for the following points.

As illustrated in (a) through (c) of FIG. 8 through FIG. 14, a connection section 50 of the flexible device 1 in accordance with Embodiment 2 includes the third housing 61, a slightly-adhesive layer 70, and a plurality of turning bodies 80, and further includes (i) a plurality of turning bodies 90 each including no teeth 85, (ii) a back surface supporting mechanism 100 (a supporting member) provided on a back surface side (i.e., a back side) of the flexible module 10, (iii) the first sliding members 110 and 140 respectively connected to a first turning body 81 and a second turning body 84 among the turning bodies 80, and (iv) the second sliding members 120 and 130 connected to the respective turning bodies 90. The slightly-adhesive layer 70 is provided on a front surface of the back surface supporting mechanism 100. The following description will discuss more details.

(Third Housing 61)

As illustrated in (a) of FIG. 13, the third housing 61 in accordance with Embodiment 2 includes, as a slide mechanism in a frame region 22, rails 67a through 67d which are parallel to short sides 61a and 61b of the third housing 61 (i.e., parallel to the racks 62 through 65) and each of which has a shape of a groove. Further, as illustrated in (a) of FIG. 13 and FIG. 14, in a flexible module-provided region 21 of the third housing 61, a recess 68 for laying therein the back surface supporting mechanism 100, which extends from the flexible module-provided region 21 to part of the frame region 22, is provided.

The rails 67a and 67b are arranged, between the racks 62 and 63 and the recess 68, along a longitudinal direction (i.e., a direction parallel to long sides 61d and 61c of the third housing 61) of the third housing 61. The rails 67c and 67d are arranged between the racks 64 and 65 and the recess 68 along the longitudinal direction of the third housing 61.

(Back Surface Supporting Mechanism 100)

As illustrated in (a) through (c) of FIG. 6 through (a) through (d) of FIG. 10, (c) of FIG. 13, and FIG. 14, the back surface supporting mechanism 100 includes (i) the plurality of back surface supporting members 101 (plate-like members) each having a shape of a prism and (ii) a joining member 102 which joins the plurality of back surface supporting members 101 together (see (a) of FIG. 8 and FIG. 14).

The back surface supporting mechanism 100 is provided so as to be expandable and contractible along a direction in which the back surface supporting members 101 are joined together. The back surface supporting mechanism 100 has an expansion and contraction mechanism of an extension type or the like, known in a form of an extension band or the like. Note that the expansion and contraction mechanism of the back surface supporting mechanism 100 is not limited to the above.

The back surface supporting members 101 are joined together by the joining member 102 so as to expand and contract along the direction in which the back surface supporting members 101 are joined together. As the joining member 102, for example, an elastic member having elasticity is suitably used. Examples of the joining member 102 encompass a joining member of a spring type, such as a plate spring. The joining member 102 may also be a resin itself which the back surface supporting members 101 are made of, or elastic links which elastically expand and contract along the direction in which the back surface supporting members 101 are joined together.

The back surface supporting members 101, for example, each have a shape of a rectangular flat plate, and are joined together, in a direction in which a short side 101a of each of the back surface supporting members 101 extends, by the joining member 102 so that plate surfaces of the back surface supporting members 101 are adjacent to each other.

Further, ones of the back surface supporting members 101 joined together which ones are located on both ends of the back surface supporting members 101 (i.e., located on outermost sides) are also joined (connected) by the joining member 102 respectively to a side surface of the first housing 31 and a side surface of the second housing 41.

Note that a long side 101b of each of the back surface supporting members 101 has a length equal to a length of the recess 68 as measured along a direction parallel to the long sides 61c and 61d of the third housing 61, and the each of the back surface supporting members 101 has a thickness (i.e., a length of a side 101e extending in a normal direction that is perpendicular to the short side 101a and the long side 101b) equal to a depth of the recess 68. In a state in which the flexible device 1 is unfolded, the back surface supporting members 101 are arranged so as to be flat as a whole. As such, a front surface of each back surface supporting member 101 is formed so as to be flush with the portions of a front surface of the first housing 31, a front surface of the second housing 41, and a front surface of the third housing 61 other than the recess 68 and the rails 67*a* through 67*d* in a state in which the flexible device 1 is unfolded.

Note that although the back surface supporting mechanism 100 is laid so as to be contained in the recess 68 of the third housing 61, the back surface supporting mechanism 100 is merely in contact with the third housing 61 and is not bonded to the third housing 61.

When the flexible device 1 is opened and closed, the back surface supporting mechanism 100 moves along the first sliding members 110 and 140 and the second sliding members 120 and 130. That is, in accordance with opening and closing of the flexible device 1, the back surface supporting mechanism 100 flexes or stretches while an interval between the back surface supporting members 101 changes, so that ones of the back surface supporting members 101, which ones are at ends of the back surface supporting members 101 in the direction in which the back surface supporting members 101 are joined together, become separated from or come into contact with the third housing 61.

Specifically, when the flexible device 1 is folded, separation of the back surface supporting members 101 of the back surface supporting mechanism 100 from the third housing 61 occurs, from the ends of the back surface supporting members 101 in the direction in which the back surface supporting members 101 are joined together. When the flexible device 1 is unfolded, contact of the back surface supporting members 101 to the third housing 61 occurs, from a central part of the back surface supporting members 101 in the direction in which the back surface supporting members 101 are joined together.

At this time, the interval between the back surface supporting members 101 changes in accordance with the opening and closing of the flexible device 1, so that the back surface supporting mechanism 100 expands and contracts along the direction in which the back surface supporting members 101 are joined together. For example, when the flexible device 1 is folded, the joining member 102 expands so as to cause an increase in interval between the back surface supporting members 101, and when the flexible device 1 is unfolded, the joining member 102 contracts so as to cause a decrease in interval between the back surface supporting members 101.

Note that the back surface supporting mechanism 100 has a structure that does not allow the back surface supporting mechanism 100 to bend to an extent that reduces a flexion radius to not more than a predetermined flexion radius. The predetermined flexion radius is determined based on a width of each back surface supporting member 101 along a direction parallel to the short side 101*a*, a length of the side 101*e*, and the like, and can be adjusted as appropriate by changing values of the width, the length, and the like.

As described above, the back surface supporting mechanism 100 is provided on the back surface side of the flexible module 10 (more specifically, between the flexible module 10 and the third housing 61). In a state in which the flexible device 1 is stopped in a position that is somewhere between a stretched state and a folded state (i.e., in a state in which turnings of the first housing 31 and the second housing 41 have been stopped midway through the turnings) as illustrated in (b) of FIG. 6 and (a) through (d) of FIG. 9, the back surface supporting mechanism 100 protects the bent part 10*c* of the flexible module 10 from a localized impact on the bent part 10*c*.

Further, in Embodiment 2, in order to prevent the flexible module 10 from being lifted when stretching, the front surfaces of the back surface supporting members 101 are subjected to a treatment for making the front surfaces slightly adhesive, so that the slightly-adhesive layer 70 is formed in a flexible module-provided region 21 on the front surfaces of the each of the back surface supporting members 101.

The back surface supporting mechanism 100, through coming into contact with the first sliding members 110 and 140 and the second sliding members 120 and 130, allows freely adjusting a clearance between the back surface supporting mechanism 100 and the flexible module 10 during an entire motion between a folded state and a stretched state of the flexible device 1.

Accordingly, when the flexible device 1 flexes, the back surface supporting mechanism 100 can have a small interval set so as not to prevent the flexion of the flexible module 10 and so as to be able to protect the flexible module 10 from a localized impact, and when the flexible device 1 stretches, the back surface supporting mechanism 100 can be brought into close contact with the flexible module 10 through the slightly-adhesive layer 70. Further, during a motion between bending and stretching of the flexible device 1, the back surface supporting mechanism 100 can have an interval set between the back surface supporting members 101 so as to be able to come into contact with and peeled from the slightly-adhesive layer 70 smoothly.

(Turning Bodies 80 and 90)

The first sliding members 110 and 140 and the second sliding members 120 and 130 are provided in the frame region 22 on the front surface of the back surface supporting mechanism 100.

The first sliding members 110 and 140 are connected respectively to the first turning body 81 and the second turning body 84 among the turning bodies 80. The second sliding members 120 and 130 are connected to the respective turning bodies 90. The following description will discuss more detail.

In Embodiment 2, among the turning bodies 80, the first turning body 81, which is located on a recess 68 side in the longitudinal direction of the third housing 61, includes, at a center of turning of the first turning body 81, an engaging protrusion 87 (a spindle) which protrudes toward the recess 68 in parallel to the long sides 61*c* and 61*d* of the third housing 61 as illustrated in (d) of FIG. 9 and (d) of FIG. 10. Accordingly, in Embodiment 2, the engaging protrusion 87 serves as a turning axis 81*a* (the center of turning) of the first turning body 81. The first turning body 81 is connected to the first sliding member 110 by the engaging protrusion 87.

Similarly, among the turning bodies 80, the second turning body 84, which is located on a recess 68 side in the longitudinal direction of the third housing 61, includes, at a center of turning of the second turning body 84, an engaging protrusion 88 (a spindle) which protrudes toward the recess 68 in parallel to the long sides 61*c* and 61*d* of the third housing 61 as illustrated in (b) of FIG. 9 and (b) of FIG. 10. Accordingly, in Embodiment 2, the engaging protrusion 88 serves as a turning axis 84*a* (the center of turning) of the first turning body 84. The second turning body 84 is connected to the first sliding member 140 by the engaging protrusion 88.

The turning bodies 90 include a turning body 91 fixed to the second housing 41 as illustrated in (d) of FIG. 9, (d) of FIG. 10, etc., and a turning body 92 fixed to the first housing 31 as illustrated in (b) of FIG. 9, (b) of FIG. 10, etc.

Note that in a case where it is unnecessary to distinguish between the turning bodies 91 and 92, the turning bodies 91 and 92 are all referred to as turning bodies 90, and turning axes 91a and 92a (the centers of turning) of the turning bodies 91 and 92 are all referred to as turning axes 90a.

Each of the turning bodies 90 has a shape similar to those of the first turning body 81 and the second turning body 84 except for including no teeth 85. Each of the turning bodies 90 is fixed to the first housing 31 or the second housing 41 by a fixation part 95 provided on a circumferential surface of the each of the turning bodies 90.

As illustrated in (d) of FIG. 9, (d) of FIG. 10, etc., among the turning bodies 90, the turning body 91 is provided so as to face and be spaced apart from a second turning body 83 among the turning bodies 80. The second turning body 83 is located on a side of an outer edge (on a long side 20a side) of a device main body 20 in the longitudinal direction of the third housing 61 and includes no engaging protrusion.

The turning body 91 includes, at a center of turning of the turning body 91, an engaging protrusion 93 (a spindle) which protrudes toward the second turning body 83 in parallel to the long sides 61c and 61d of the third housing 61. Accordingly, in Embodiment 2, the engaging protrusion 93 serves as the turning axis 91a (the center of turning) of the turning body 91. The turning body 91 is connected to the second sliding member 120 by the engaging protrusion 93.

As illustrated in (b) of FIG. 9, (b) of FIG. 10, etc., the turning body 92 is provided so as to face and be spaced apart from a second turning body 82 among the turning bodies 80. The second turning body 82 is located on a side of an outer edge of the device main body 20 in the longitudinal direction of the third housing 61 and includes no engaging protrusion.

The turning body 92 includes, at a center of turning of the turning body 92, an engaging protrusion 94 (a spindle) which protrudes toward the first turning body 82 in parallel to the long sides 61c and 61d of the third housing 61. Accordingly, in Embodiment 2, the engaging protrusion 94 serves as the turning axis 92a (the center of turning) of the turning body 92. The turning body 92 is connected to the second sliding member 130 by the engaging protrusion 94.

(First Sliding Members 110 and 140 and Second Sliding Members 120 and 130)

The first sliding member 110 and the first sliding member 140 are identical in structure as illustrated in, for example, (a) and (b) of FIG. 12. The second sliding member 120 and the second sliding member 130 are identical in structure as illustrated in, for example, (a) and (b) of FIG. 11.

As illustrated in (a) and (b) of FIG. 12, (a) and (b) of FIG. 11, etc., each of the first sliding members 110 and 140 and the second sliding members 120 and 130 has, for example, a shape of a cylinder from which a portion is cut out.

As illustrated in FIG. 7, (a) and (b) of FIG. 12, etc., the first sliding member 140 includes a bottom part 140a and an arc part 140b when viewed along an axis direction (a cylindrical axis direction, specifically, a direction parallel to the engaging protrusion 88) of the first sliding member 140.

Accordingly, as illustrated in (a) and (b) of FIG. 12 etc., the first sliding member 110 also includes a bottom part 110a and an arc part 110b when viewed along an axis direction (a cylindrical axis direction, specifically, a direction parallel to the engaging protrusion 87) of the first sliding member 110.

Further, as illustrated in FIG. 7, (a) and (b) of FIG. 11, etc., the second sliding member 130 also includes a bottom part 130a and an arc part 130b when viewed along an axis direction (a cylindrical axis direction, specifically, a direction parallel to the engaging protrusion 94) of the second sliding member 130.

Accordingly, as illustrated in (a) and (b) of FIG. 11 etc., the second sliding member 120 also includes a bottom part 120a and an arc part 120b when viewed along an axis direction (a cylindrical axis direction, specifically, a direction parallel to the engaging protrusion 95) of the second sliding member 120.

Each of the bottom parts 110a, 120a, 130a, and 140a forms a surface parallel to the front surface of the third housing 61.

As illustrated in (a) and (b) of FIG. 12 etc., the bottom part 110a of the first sliding member 110 is provided with a protruding part 111 which is perpendicular to the cylindrical axis direction (the direction parallel to the engaging protrusion 87) and protrudes in a horizontal direction (i.e., a direction parallel to the front surface of the third housing 61).

On a back surface of the first sliding member 110, a protrusion 112 is provided so as to extend from the bottom part 110a, which is parallel to the front surface of the third housing 61, to the protruding part 111. The protrusion 112 is, for example, T-shaped, and engages with the groove of the rail 67a of the third housing 61.

Similarly, the bottom part 140a of the first sliding member 140 is provided with a protruding part 141 which is perpendicular to the cylindrical axis direction (the direction parallel to the engaging protrusion 88) and protrudes in the horizontal direction.

On a back surface of the first sliding member 140, a protrusion 142 is provided so as to extend from the bottom part 140a, which is parallel to the front surface of the third housing 61, to the protruding part 141. The protrusion 142 is, for example, T-shaped, and engages with the groove of the rail 67d of the third housing 61.

Further, as illustrated in (a) and (b) of FIG. 11 etc., the bottom part 120a of the second sliding member 120 is provided with a protruding part 121 which is perpendicular to the cylindrical axis direction (the direction parallel to the engaging protrusion 93) and protrudes in the horizontal direction.

On a back surface of the second sliding member 120, a protrusion 122 is provided so as to extend from the bottom part 120a, which is parallel to the front surface of the third housing 61, to the protruding part 121. The protrusion 122 is, for example, T-shaped, and engages with the groove of the rail 67b of the third housing 61.

Similarly, the bottom part 130a of the second sliding member 130 is provided with a protruding part 131 which is perpendicular to the cylindrical axis direction (the direction parallel to the engaging protrusion 94) and protrudes in the horizontal direction.

On a back surface of the second sliding member 130, a protrusion 132 is provided so as to extend from the bottom part 130a, which is parallel to the front surface of the third housing 61, to the protruding part 131. The protrusion 132 is, for example, T-shaped, and engages with the groove of the rail 67c of the third housing 61.

By causing the protrusions 112, 122, 132, and 142 to engage with the respective grooves of the rails 67a through 67d, it is possible to cause the first sliding members 110 and 140 and the second sliding members 120 and 130 to move by sliding on the third housing 61 stably along the short sides 61a and 61b of the third housing 61.

Further, by forming each of the protrusions 112, 122, 132, and 142 in a T-shape, it is possible to prevent the protrusions 112, 122, 132, and 142 from being detached from the grooves of the rails 67a through 67d.

As illustrated in (b) and (c) of FIG. 13 etc., the first sliding member 140 and the second sliding member 130 can be combined together. The first sliding member 140 includes a recess 143 in which the protruding part 131 of the second sliding member 130 is fitted.

As illustrated in (a) through (d) of FIG. 9, when the flexible device 1 is folded, the first sliding member 140 and the second sliding member 130 are joined together so as to overlap with each other so that the cylindrical axes of the first sliding member 140 and the second sliding member 130 are located on a single straight line. In other words, when the flexible device 1 is folded, the first sliding member 140 and the second sliding member 130 are joined together so as to overlap with each other so that the engaging protrusion 88 and the engaging protrusion 94 are located on a single straight line.

Accordingly, similarly to the first sliding member 140 and the second sliding member 130, the first sliding member 110 and the second sliding member 120 can be combined together. As illustrated in (a) and (b) of FIG. 12 etc., the first sliding member 110 has a recess 113 in which the protruding part 121 of the second sliding member 120 is fitted.

When the flexible device 1 is folded, the first sliding member 110 and the second sliding member 120 are joined together so as to overlap with each other so that the cylindrical axes of the first sliding member 110 and the second sliding member 120 are located on a single straight line. In other words, when the flexible device 1 is folded, the first sliding member 110 and the second sliding member 120 are joined together so as to overlap with each other so that the engaging protrusion 87 and the engaging protrusion 93 are located on a single straight line.

As illustrated in (d) of FIG. 9, (d) of FIG. 10, (a) and (b) of FIG. 12, and FIG. 14, in order for the engaging protrusion 87 of the first turning body 81 to be located on an extension line of the cylindrical axis of the first sliding member 110, the first sliding member 110 has formed therein an engaging hole 114 which extends along the cylindrical axis of the first sliding member 110 and into which the engaging protrusion 87 is inserted.

Further, in order for the engaging protrusion 93 of the turning body 91 to be located on an extension line of the cylindrical axis of the second sliding member 120, the second sliding member 120 has formed therein an engaging hole 124 which extends along the cylindrical axis of the second sliding member 120 and into which the engaging protrusion 93 is inserted.

As illustrated in (a) through (d) of FIG. 9, (a) through (d) of FIG. 10, and (a) and (b) of FIG. 11, in order for the engaging protrusion 88 of the second turning body 84 to be located on an extension line of the cylindrical axis of the first sliding member 140, the first sliding member 140 has formed therein an engaging hole 144 which extends along the cylindrical axis of the first sliding member 140 and into which the engaging protrusion 88 is inserted.

Further, in order for the engaging protrusion 94 of the turning body 92 to be located on an extension line of the cylindrical axis of the second sliding member 130, the second sliding member 130 has formed therein an engaging hole 134 which extends along the cylindrical axis of the second sliding member 130 and into which the engaging protrusion 94 is inserted.

As illustrated in FIG. 14, a tubular member 115, into which the engaging protrusion 87 inserted in the engaging hole 114 is inserted, is provided inside the engaging hole 114. In order for the engaging protrusion 87 inserted in the tubular member 115 to turn freely in the tubular member 115, a slight gap is provided between an inner wall of the tubular member 115 and the engaging protrusion 87. That is, the tubular member 115 is formed in a size larger than that of the engaging protrusion 87, and the engaging protrusion 87 is loosely inserted in the tubular member 115.

Note that although not illustrated, tubular members each of which is similar to the tubular member 115 are also provided in the respective engaging holes 124, 134, and 144. Note that these tubular members are not essential.

According to Embodiment 2, the engaging protrusions 87 and 94, which are respective turning axes of the first turning body 81 and the turning body 92 fixed to the first housing 31, and the engaging protrusions 88 and 93, which are respective turning axes of the second turning body 84 and the turning body 91 fixed to the second housing 41, push, in accordance with turnings of the turning bodies 80 and 90 caused by unfolding or folding of the flexible device 1, an inner wall of the tubular member 115 and the like of a corresponding one of the engaging holes 114, 124, 134, and 144 along the short sides 61a and 61b of the third housing 61. This causes the first sliding members 110 and 140 and the second sliding members 120 and 130 to slide on the front surface of the back surface supporting mechanism 100 while a positional relationship between each of the turning bodies 80 and 90 and a corresponding one of the arc parts 110b, 120b, 130b, and 140b of the first sliding members 110 and 140 and the second sliding members 120 and 130 is maintained constant.

In accordance with movements of the engaging holes 114, 124, 134, and 144, the first sliding members 110 and 140 and the second sliding members 120 and 130 move by sliding along a corresponding one of the grooves of the rails 67a through 67d of the third housing 61, while the first sliding members 110 and 140 and the second sliding members 120 and 130 themselves do not rotate or turn.

Each of the arc parts 110b, 120b, 130b, and 140b serves as a guide part which guides flexion and stretching of the back surface supporting mechanism 100 and movements of the back surface supporting members 101.

(Transitions of Turning Axes and Fixed Ends of Flexible Module 10)

The following description will discuss, with reference to (a) through (c) of FIG. 6 and FIG. 7, transitions of the turning axes 11a and 12a and the fixed ends 10a and 10b of the flexible module 10 in accordance with opening and closing operations of the flexible device 1 of Embodiment 2.

Note that the circles 151 and 152 indicated with dotted lines in (a) through (c) of FIG. 6 are circles (i.e., circles each including, as part of an arc of the circle, part of a corresponding one of the first sliding members 110 and 140 and the second sliding members 120 and 130) each of which centers around a corresponding one of the engaging protrusions 87, 88, 93, and 94 connected to the first sliding members 110 and 140 and the second sliding members 120 and 130 and has an outer periphery that coincides with an outer periphery of the flexible module 10 at bottom surfaces of the each of the circles and the flexible module 10.

In Embodiment 2, too, as illustrated in (a) through (c) of FIG. 6, in a view in which the flexible module 10 in a folded state is divided into a left half and a right half along the turning axes 11a and 12a of the flexible module 10, (i) transitions of the turning axes 11a and 12a of the flexible module 10 are in a plane-symmetrical relationship with each other and (ii) a transition of the fixed end 10a, which is fixed to the first housing 31, and a transition of the fixed end 10b, which is fixed to the second housing 41, are in a plane-symmetrical relationship with each other. As such, in Embodiment 2, too, transitions (i.e., transitions of the engaging protrusions 87, 88, 93, and 94) of the turning axes 11a and 12a of the flexible module 10 are similar to the illustration in FIG. 5.

In Embodiment 2, a mechanism is employed in which the first sliding members 110 and 140 and the second sliding members 120 and 130 slide with use of the transitions (horizontal movements of the turning axes 80a and 90a of the turning bodies 80 and 90) of the engaging protrusions 87, 88, 93, and 94.

As illustrated in (a) through (c) of FIG. 6 and FIG. 7, each of the arc parts 110b, 120b, 130b, and 140b has a radius greater than a flexion diameter (i.e., the above-described radius R1 of each of the circles 11 and 12) of the flexible module 10. Further, a portion of an outer periphery of each of the first sliding members 110 and 140 and the second sliding members 120 and 130 which portion is immediately below a corresponding one of the engaging protrusions 87, 88, 93, and 94 is located in the same position as that of the flexible module 10 (that is, an outer periphery of each of the first sliding members 110 and 140 and the second sliding members 120 and 130 coincides with an outer periphery of the flexible module 10 at a bottom surface of the each of the first sliding members 110 and 140 and the second sliding members 120 and 130 and at the bottom surface of the flexible module 10).

Accordingly, the back surface supporting members 101 move on an outer side of a trajectory (i.e., a trajectory of a circumference of the flexible module 10) of a circumference of each of the turning bodies 80 and 90.

Advantageous Effects

As described above, according to Embodiment 2, the back surface supporting mechanism 100 including the plurality of back surface supporting members 101 is provided between the flexible module 10 and the third housing 61. The back surface supporting mechanism 100 is provided so as to be bendable in accordance with turnings of the first housing 31 and the second housing 41, due to a change in size of a gap between adjacent ones of the back surface supporting members 101. As such, according to Embodiment 2, the back surface supporting mechanism 100 can be disposed, as a supporting member for supporting the flexible module 10, on the back surface of the flexible module 10 even when the flexible module 10 is in a position that is somewhere between a stretched state and a folded state. Accordingly, in Embodiment, the bent part 10c of the flexible module 10 can be protected from a localized impact on the bent part 10c even in a state in which opening and closing of the flexible device 1 have been stopped in a position that is somewhere between a stretched state and a flexed state of the flexible module 10. As such, according to Embodiment 2, it is possible to obtain the flexible device 1 which has excellent impact resistance.

Further, according to Embodiment 2, as described above, the first sliding members 110 and 140 and the second sliding members 120 and 130 slide with use of horizontal movements of the turning axes 80a and 90a of the turning bodies 80 and 90. In Embodiment 2, the back surface supporting members 101 move along the first sliding members 110 and 140 and the second sliding members 120 and 130 in accordance with turnings of the turning bodies 80 and 90. This allows freely adjusting a clearance between the back surface supporting members 101 and the flexible module 10 with use of the first sliding members 110 and 140 and the second sliding members 120 and 130, in all states between a flexed state and a stretched state of the flexible module 10.

The slightly-adhesive layer 70 is disposed on the front surfaces of the back surface supporting members 101, and in a state where the flexible module 10 is stretched, the flexible module 10 is in contact with the back surface supporting members 101. In a case where the flexible module 10 and the slightly-adhesive layer 70 remain in close contact with each other during flexing and stretching actions of the flexible module 10, stress is given on the flexible module 10. However, the use of the first sliding members 110 and 140 and the second sliding members 120 and 130 allows the flexible module 10 and the back surface supporting members 101 to be attached to and detached from each other in a substantially flat state which does not cause stress on the flexible module 10.

Further, according to Embodiment 2, the first sliding members 110 and 140 and the second sliding members 120 and 130 include the respective bottom parts 110a, 120a, 130a, and 140a and the respective arc parts 110b, 120b, 130b, and 140b. Accordingly, before the back surface supporting members 101 come in contact with the flexible module 10, the back surface supporting members 101 can be sequentially lined up in a state in which the joining member 102 connecting the back surface supporting members 101 together contracts the most (i.e., a state in which the back surface supporting members 101 are arranged so as to be flat as a whole).

Note that, as described above, according to Embodiment, the first sliding members 110 and 140 and the second sliding members 120 and 130 only need to include the respective bottom parts 110a, 120a, 130a, and 140a and the respective arc parts 110b, 120b, 130b, and 140b, and are not limited to a particular shape.

Accordingly, each of the first sliding members 110 and 140 and the second sliding members 120 and 130 may have an elliptical shape or any shape such as a combination of curves having respective different arc diameters, a combination of an arc and a straight line, and the like.

As described above, each of the arc parts 110b, 120b, 130b, and 140b of the first sliding members 110 and 140 and the second sliding members 120 and 130 has a radius greater than that of each of the turning bodies 80 and 90, and the back surface supporting members 101 move on an outer side of the trajectory of the circumference of the each of the turning bodies 80 and 90 in accordance with turnings of the turning bodies 80 and 90. This allows a distance between the back surface supporting members 101 and the flexible module 10 to be set to any distance.

Embodiment 3

The following will describe Embodiment 3 of the present invention with reference to (a) through (d) of FIG. 15. Note that Embodiment 3 will also describe differences from Embodiment 1. The same reference signs are given to members having functions identical to those of members described in Embodiment 1, and descriptions of such members are therefore omitted.

<Schematic Configuration of Flexible Device 1>

(a) through (d) of FIG. 15 are views each illustrating a schematic configuration of a main part of a flexible device 1 in accordance with Embodiment 3, the views sequentially illustrating a series of states starting from a state in which the flexible device 1 is folded (bent state) to a state in which the flexible device 1 is unfolded.

The flexible device 1 in accordance with Embodiment 3 is identical to the flexible device 1 in accordance with Embodiment 1 except for including a movement mechanism which, in a state where the flexible device 1 is folded, causes at least one of (i) a third housing 61 and (ii) a first housing 31, a second housing 41, and a flexible module 10 to move with respect to the other so as to cause a change in area of contact between the flexible module 10 and a connection section 50 (more specifically, an area of contact between the flexible module 10 and a slightly-adhesive layer 70).

In Embodiment 3, the following description will discuss an example case in which the movement mechanism is an expansion and contraction mechanism which is provided so as to be expandable and contractible. That is, the flexible device 1 in accordance with Embodiment 3 is identical to the flexible device 1 in accordance with Embodiment 1 except that, as illustrated in, for example, (a) and (b) of FIG. 15, (i) turning bodies 80 are connected via an expansion and contraction mechanism 89 to the first housing 31 and the second housing 41 through an expansion and contraction mechanism 89, and the expansion and contraction mechanism 89 expands and contracts when the flexible device 1 is opened and closed.

Note that although (a) through (d) of FIG. 15 illustrates a first turning body 82 and a second turning body 84 as examples of the turning bodies, but the same illustration applies to a first turning body 81 and a second turning body 83 as well.

In Embodiment 1, as illustrated in, for example, (a) and (b) of FIG. 1 and FIG. 5, in a state where the flexible device 1 is folded or in a state where the flexible device 1 is being unfolded or being folded, the bent part 10c of the flexible module 10 is lifted above the third housing 61 in the vicinity of the boundary of the third housing 61 with respect to each of the first housing 31 and the second housing 41.

In a state where the flexible device 1 is folded, the first housing 31 and the second housing 41 are closed. This enables a structure (not illustrated) in which, in a state where the flexible device 1 is folded, the bent part 10c of the flexible module 10 is not exposed to an outside even if the bent part 10c of the flexible module 10 is lifted above the third housing 61 in the vicinity of the boundary of the third housing 61.

However, in a state where the flexible device 1 is being unfolded or being folded, the bent part 10c of the flexible module 10 is exposed to the outside, so that the flexible module 10 may become damaged.

In order to suppress this lift of the flexible module 10 in a state where the flexible device 1 is being unfolded or being folded, it is necessary to reduce a flexion diameter (radius R1) of the flexible module 10 in this state.

However, in actual use, the flexible device 1 is held for a long time in a state where the flexible module 10 is bent. It is desirable that the flexible module 10 in the bent state have a large flexion diameter (radius R1).

In view of the above, in Embodiment 3, the turning bodies 80 are connected to the first housing 31 and the second housing 41 through the expansion and contraction mechanism 89 which is provided so as to be expandable and contractible.

The expansion and contraction mechanism 89 is not particularly limited, and may be, for example, (i) an expansion and contraction mechanism that uses an expanding and contracting member (e.g., a spring which expands and contracts by electromagnetic force) which itself expands and contracts, or an actuator-type expansion and contraction mechanism that includes a protruding member which protrudes by electromagnetic force or protrudes mechanically by means of a sliding member or the like.

According to Embodiment 3, when the flexible device 1 is unfolded (during an unfolding action of the flexible device 1), the expansion and contraction mechanism 89 is caused to contract as illustrated in, for example, (b) of FIG. 15, so that the first housing 31 and the second housing 41, which are connected to the expansion and contraction mechanism 89, approach a front surface of the third housing 61 by a distance corresponding to the contraction of the expansion and contraction mechanism 89. In other words, a position of each of fixed ends 10a and 10b, which are fixed to the first housing 31 and the second housing 41, of the flexible module 10 is lowered by a distance corresponding to the contraction of the expansion and contraction mechanism 89, as compared with a state in which the flexible device 1 is folded.

As a result, a flexion diameter (flexion radius) of the flexible module 10 becomes equal to an arc diameter of the turning body 80. In this state, the turning body 80 is caused to turn so as to stretch the flexible device 1 as illustrated in (a) and (b) of FIG. 15. Meanwhile, in a case where the flexible device 1 is folded, the expansion and contraction mechanism 89 is caused to expand during a folding action of the flexible device 1.

Thus, according to Embodiment 3, a flexion diameter of a bent part 10c of the flexible module 10 in a state where the flexible device 1 is being unfolded or being folded can be made smaller than that in a state where the flexible device 1 is bent. This allows preventing the flexible module 10 from becoming damaged in a state where the flexible device 1 is being unfolded or being folded.

In Embodiment 3, as an example, (i) an arc diameter of each turning body 80, and a flexion diameter (radius R1) of the bent part 10c of the flexible module 10 as measured in a case in which the expansion and contraction mechanism 89 is caused to contract as illustrated in (b) of FIG. 15 at a start of unfolding of the flexible device 1, are each set to 1.5 mm and (ii) a flexion diameter (radius R1) of the bent part 10c of the flexible module 10 in a state where the flexible device 1 is bent as illustrated in (a) of FIG. 15 is set to 3 mm.

Note that Embodiment 3 has been discussed with reference to an example case in which the flexible device 1 in accordance with Embodiment 1 is configured such that each of the turning bodies 80 is fixed to the first housing 31 or the second housing 41 through the expansion and contraction mechanism 89. Note, however, that Embodiment 3 is not limited to this, and may employ a configuration in which each of the turning bodies 80 and each of the turning bodies 90 in Embodiment 2 are each fixed to the first housing 31 or the second housing 41 through the expansion and contraction mechanism 89. This configuration allows the flexible device 1 in accordance with Embodiment 2 to bring about the advantageous effects described above.

Note that although Embodiment 3 has been discussed with reference to an example case in which the movement mechanism is the expansion and contraction mechanism 89 as described above, Embodiment 3 is not limited to this. For example, the movement mechanism may be a lifting mechanism. For example, in a case where the lifting mechanism causes the third housing 61 in a state illustrated in (a) of FIG. 15 to move upward in (a) of FIG. 15 with respect to the first housing 31, the second housing 41, and the flexible module 10, that is, in a direction approaching the first housing 31, the second housing 41, and the flexible module 10, a state illustrated in (b) of FIG. 15 can be realized. Further, in a case where the lifting mechanism causes the third housing 61 in a state illustrated in (b) of FIG. 15 to move downward in (b)

of FIG. 15 with respect to the first housing 31, the second housing 41, and the flexible module 10, that is, in a direction away from the first housing 31, the second housing 41, and the flexible module 10, a state illustrated in (a) of FIG. 15 can be realized.

Modified Examples

The following description will discuss modified examples of Embodiments 1 through 3. Note that the following description will describe differences from Embodiments 1 through 3. The same reference signs are given to members having functions identical to those of members described in Embodiments 1 through 3, and descriptions of such members are therefore omitted.

(Turnings of First Housing 31 and Second Housing 41)

(a) of FIG. 16 is a view illustrating an example of a schematic configuration of a main part of a flexible device 1 in accordance with Modified Example in a state where the flexible device 1 is folded, together with a trajectory of transition of a fixed end 10a of a flexible module 10. (b) of FIG. 16 is a view illustrating how the fixed end 10a of the flexible module 10 makes a transition as well as how the first housing 31 rolls, between a state in which the flexible device 1 in accordance with Modified Example is folded and a state in which the flexible device 1 is unfolded.

Although each of Embodiments 1 through 3 has been discussed with reference to an example case in which the first housing 31 and the second housing 41 are caused to turn, a method of turning of the first housing 31 and the second housing 41 is not limited to this. It is possible to employ a configuration in which only one of the first housing 31 and the second housing 41 turns.

In this case, as illustrated in (a) and (b) of FIG. 16, for example, the fixed end 10a, which is fixed to the first housing 31, of the flexible module 10 may serve as a turning axis of the first housing 31, and the position of the turning axis may be changed continuously.

Although (a) and (b) of FIG. 16 illustrates an example case in which the first housing 31, out of the first housing 31 and the second housing 41, is caused to turn, it is of course possible to employ a configuration in which the second housing 41 is caused to turn. In this case, a fixed end 10b, which is fixed to the second housing 41, of the flexible module 10 may serve as a turning axis of the second housing 41, and a position of the turning axis may be changed continuously.

(Bending Direction of Flexible Module 10)

Although each of Embodiments 1 through 3 has been discussed with reference to an example case in which the organic EL display panel, which is used as the flexible module 10, is bent so that a display surface of the organic EL display panel is on an inner side, the flexible device 1 may be a display device which can both be bent so that a display surface of the display device is on an inner side and be bent so that the display surface is on an outer side. That is, the flexible module 10 and the flexible device 1 may be bent on a front surface side and on a back surface side. In a case where the first housing 31, the second housing 41, and the third housing 61 are each a transparent member, a flexible device 1 that is bendable outward can be obtained.

(Turning of Turning Bodies 80)

Although each of Embodiments 1 through 3 has been discussed with reference to an example case in which a gear (a pinion gear) is used for allowing the turning bodies to turn in accordance with turnings of the first housing 31 and the second housing 41, Embodiment 3 is not limited to this.

Further, turning of each turning body 80 and actions of the turning axis of the first housing 31 and the turning axis of the second housing 41 in conjunction with one another may be realized with use of a gear, a belt, a chain, friction, an electrical motor, or the like.

(Electronic Device)

As an aspect of the present invention, an electronic device including each flexible device 1 described above is not particularly limited, and may be various electronic devices such as a laptop PC, a mobile phone, and a mobile information terminal.

[Recap]

A flexible device 1 in accordance with Aspect 1 of the present invention is a flexible device, including: a flexible module 10; and a holding body (a device main body 20) holding the flexible module 10, the holding body including: a first housing 31 and a second housing 41 facing each other when the flexible module 10 is bent; and a connection section 50 connecting the first housing 31 and the second housing 41 to each other so that the first housing 31 and the second housing 41 are turnable, a surface of the flexible module 10 which surface faces the first housing 31 and the second housing 41 being fixed to the first housing 31 and the second housing 41, the connection section 50 including: a third housing 61 disposed so as to face a bent part 10c of the flexible module 10; and a plurality of turning bodies 80, each of the plurality of turning bodies 80 being fixed to the first housing 31 or the second housing 41, the plurality of turning bodies 80 rolling on the third housing 61 so that a turning axis 80a of the each of the plurality of turning bodies 80 horizontally moves when the flexible module 10 is bent.

According to the configuration above, the turning axis 80a of each of the plurality of turning bodies 80 rolling on the third housing 61, which is disposed so as to face the bent part 10c of the flexible module 10, horizontally moves at the connection section 50 when the flexible module 10 is stretched or bent. As such, the bent part 10c of the flexible module 10 does not become twisted or distorted, in contrast to a case in which a turning axis is fixed as in Patent Literature 1. This enables an improvement in display quality and reliability of the flexible device 1 over conventional technology.

In Aspect 2 of the present invention, the flexible device 1 in accordance with Aspect 1 may be configured such that the connection section 50 further includes a slightly-adhesive layer 70; and the slightly-adhesive layer 70 has slight adhesion or slight adsorptivity and is provided on a surface of the connection section 50 which surface comes in contact with the bent part 10c of the flexible module 10.

According to the configuration above, an area of contact between the flexible module 10 and the slightly-adhesive layer 70 changes in accordance with turnings of the first housing 31 and the second housing 41. This enables both (i) achieving a function of holding the bent part 10c of the flexible module 10 with respect to the third housing 61 in a planar manner when the flexible device 1 is stretched and (ii) attaching and detaching the flexible module 10 and the third housing 61 to and from each other without stress on the flexible module 10. Further, the bent part 10c of the flexible module 10 is in contact with the slightly-adhesive layer 70 during opening and closing actions performed by folding and unfolding of the flexible device 1. This allows preventing the flexible module 10 from having a twist, a distortion, and the like when the flexible module 10 is unfolded (stretched) or bent. Accordingly, it becomes possible to suppress degradation in operability in a touching operation and the like and degradation in visibility such as display quality.

In Aspect 3 of the present invention, the flexible device 1 in accordance with Aspect 2 may be configured such that the slightly-adhesive layer 70 is disposed on a surface of the third housing 61 which surface faces the flexible module 10.

According to the configuration above, the slightly-adhesive layer 70 is disposed on the surface of the third housing 61 which surface faces the flexible module 10. This allows reliably bringing the slightly-adhesive layer 70 into contact with the bent part 10c of the flexible module 10 with a simple configuration. Accordingly, it becomes possible, with a simple configuration, to prevent reliably the flexible module 10 from having a twist, a distortion, and the like.

In Aspect 4 of the present invention, the flexible device 1 in accordance with any one of Aspects 1 through 3 may be configured such that the bent part 10c of the flexible module 10 in a state where the flexible device 1 is being folded or being unfolded has a flexion radius smaller than that in a state where the flexible device 1 is folded.

According to the configuration above, it is possible to prevent the flexible module 10 from becoming damaged in a state where the flexible device 1 is being unfolded or being folded.

In Aspect 5 of the present invention, the flexible device 1 in accordance with Aspect 4 may be configured such that the flexible device 1 further includes a movement mechanism (e.g., an expanding and contracting member 89, a lifting mechanism, or the like) which, in the state where the flexible device 1 is folded, causes at least one of (i) the third housing 61 and (ii) the first housing 31, the second housing 41, and the flexible module 10 to move with respect to the other so as to cause a change in area of contact between the flexible module 10 and the connection section 50.

According to the configuration above, the movement mechanism can be caused to move so as to cause a change in area of contact between the flexible module 10 and the connection section 50 in a state where the flexible device 1 is folded. That is, the configuration above allows at least one of (i) the third housing 61 and (ii) the first housing 31, the second housing 41, and the flexible module 10 to move so as to come in proximity to or become separated from the other.

Thus, according to the configuration above, a flexion diameter of the bent part 10c of the flexible module 10 in a state where the flexible device 1 is being unfolded or being folded can be made smaller than that in a state where the flexible device 1 is bent. Accordingly, the configuration above allows preventing the flexible module 10 from becoming damaged in a state where the flexible device 1 is being unfolded or being folded.

In Aspect 6 of the present invention, the flexible device 1 in accordance with Aspect 5 may be configured such that the movement mechanism is an expansion and contraction mechanism 89 which is provided so as to be expandable and contractible; and each of the plurality of turning bodies 80 is fixed to the first housing 31 or the second housing 41 through the expansion and contraction mechanism 89.

According to the configuration above, it is possible to cause the expansion and contraction mechanism 89 to contract when the flexible device 1 is unfolded, and cause the expansion and contraction mechanism 89 to expand when the flexible device 1 is folded.

Thus, according to the configuration above, a flexion diameter of the bent part 10c of the flexible module 10 in a state where the flexible device 1 is being unfolded or being folded can be made smaller than that in a state where the flexible device 1 is bent. Accordingly, the configuration above allows preventing the flexible module 10 from becoming damaged in a state where the flexible device 1 is being unfolded or being folded.

In Aspect 7 of the present invention, the flexible device 1 in accordance with Aspect 2 or 3 may be configured such that: the connection section 50 further includes a supporting member (a back surface supporting mechanism 100) between the flexible module 10 and the third housing 61, the supporting member including a plurality of plate-like members (back surface supporting members 101) and being provided so as to be bendable, through a change in size of a gap between adjacent ones of the plurality of plate-like members, in accordance with turning of each of the first housing 31 and the second housing 41; and the slightly-adhesive layer 70 is disposed on a surface of the supporting member which surface faces the flexible module 10.

According to the configuration above, when the flexible module 10 is bent, the supporting member comes in contact with the bent part 10c of the flexible module 10 through the slightly-adhesive layer 70. As such, according to the configuration above, the supporting member for supporting the flexible module 10 can be disposed on a back surface of the flexible module 10 even when the flexible module 10 is in a position that is somewhere between a stretched state and a folded state. As such, according to the configuration above, the bent part 10c of the flexible module 10 can be protected from a localized impact on the bent part 10c even in a state in which opening and closing of the flexible device 1 have been stopped in a position that is somewhere between a stretched state and a flexed state of the flexible module 10. This allows providing the flexible device 1 which has excellent impact resistance.

In Aspect 8 of the present invention, the flexible device 1 in accordance with Aspect 7 may be configured such that the flexible device 1 further includes a sliding member (first sliding members 110 and 140, second sliding members 120 and 130) moving by sliding in accordance with turning of the each of the plurality of turning bodies 80, the plurality of plate-like members moving along the sliding member in accordance with the turning of the each of the plurality of turning bodies 80.

According to the configuration above, the plurality of plate-like members move along the sliding member in accordance with turning of each of the plurality of turning bodies. This allows freely adjusting a clearance between the plurality of plate-like members and the flexible module 10, in all states between a flexed state and a stretched state of the flexible module 10.

In Aspect 9 of the present invention, the flexible device 1 in accordance with Aspect 8 may be configured such that the sliding member includes an arc part (arc parts 110b, 120b, 130b, and 140b) and a bottom part (bottom parts 110a, 120a, 130a, and 140a).

According to the configuration above, before the plurality of plate-like members come in contact with the flexible module 10, the plurality of plate-like members can be sequentially lined up in a state in which the plurality of plate-like members are arranged so as to be flat as a whole.

In Aspect 10 of the present invention, the flexible device 1 in accordance with Aspect 9 may be configured such that: the arc part of the sliding member has a radius greater than that of the each of the plurality of turning bodies 80; and the plurality of plate-like members move on an outer side of a trajectory of a circumference of the each of the plurality of turning bodies 80 in accordance with the turning of the each of the plurality of turning bodies 80.

The configuration above allows a distance between the plurality of plate-like members and the flexible module 10 to be set to any distance.

In Aspect 11 of the present invention, the flexible device 1 in accordance with any one of Aspects 8 through 10 may be configured such that: one of the third housing 61 and the sliding member includes a rail (rails 67a, 67b, 67c, and 67d) in a direction perpendicular to the turning axis 80a of the each of the plurality of turning bodies 80; and the other of the third housing 61 and the sliding member includes a protrusion (protrusions 112, 122, 132, and 142) which is fitted in a groove of the rail.

According to the configuration above, by causing the protrusion to engage with the groove of the rail, it is possible to cause the sliding member to move by sliding on the third housing 61 stably in the direction perpendicular to the turning axis 80a of the each of the plurality of turning bodies 80.

In Aspect 12 of the present invention, the flexible device 1 in accordance with any one of Aspects 1 through 11 may be configured such that: the each of the plurality of turning bodies 80 is a pinion including a plurality of teeth 85 which are parallel to the turning axis 80a; the third housing 61 includes a rack which is provided parallel to a direction perpendicular to the turning axis 80a of the each of the plurality of turning bodies 80, the rack including a plurality of teeth 66 which are parallel to the turning axis 80a; and the each of the plurality of turning bodies 80 turns on the rack while being engaged with the rack.

According to the configuration above, when a turning force is applied to the each of the plurality of turning bodies 80, the turning axis 80a of the each of the plurality of turning bodies 80 moves in a horizontal direction to an end of the rack on which the teeth 66 are provided. This causes a turning motion of the each of the plurality of turning bodies 80 to be converted into a linear motion of the turning axis 80a of the each of the plurality of turning bodies 80, so that the turning axis 80a of the each of the plurality of turning bodies 80 makes a transition in the horizontal direction (a horizontal movement).

Further, according to the configuration above, since the each of the plurality of turning bodies 80 turns on the rack while being engaged with the rack, the each of the plurality of turning bodies 80 can turn stably in the direction perpendicular to the turning axis 80a of the each of the plurality of turning bodies 80.

In Aspect 13 of the present invention, the flexible device 1 in accordance with any one of Aspects 1 through 12 may be configured such that the flexible module 10 is a display panel.

According to the configuration above, in a caser where the flexible module 10 is a display panel, the display panel itself does not have a twist, a distortion, and the like. This allows suppressing degradation of display quality of the display panel, and allows properly performing a touching operation and the like on the display panel.

The present invention is not limited to the embodiments, but can be altered by a skilled person in the art within the scope of the claims. The present invention also encompasses, in its technical scope, any embodiment derived by combining technical means disclosed in differing embodiments. Further, it is possible to form a new technical feature by combining the technical means disclosed in the respective embodiments.

REFERENCE SIGNS LIST

1: flexible device
10: flexible module
10a, 10b: fixed end
11, 12: circle
11a, 12a: turning axis
20: device main body (holding body)
20a, 20b, 31c, 31d, 41c, 41d, 61c, 61d, 101b: long side
20c, 20d, 31a, 31b, 41a, 41b, 61a, 61b, 101a: short side
21: flexible module-provided region
22: frame region
30: first housing section
31: first housing
32, 42: adhesive layer
33: notch part
40: second housing section
41: second housing
50: connection section
61: third housing
62, 63, 64, 65: rack
66, 85: teeth
67a, 67b, 67c, 67d: rail
68: recess
70: slightly-adhesive layer
80, 90, 91, 92: turning body
80a, 81a, 82a, 83a, 84a, 90a, 91a, 92a: turning axis
81, 82: first turning body
83, 84: second turning body
86, 95: fixation part
87, 88, 93, 94: engaging protrusion
89: expansion and contraction mechanism
100: back surface supporting mechanism
101: back surface supporting member
102: joining member
110, 140: first sliding member
110a, 120a, 130a, 140a: bottom part
110b, 120b, 130b 140b: arc part
111, 121, 131, 141: protruding part
112, 122, 132, 142: protrusion
113, 143: recess
114, 124, 134, 144: engaging hole
115: tubular member
120, 130: second sliding member
300: display device
301, 302: housing
303: hinge section
303a: turning axis
304: display panel
304b: portion (portion flexed in S-shape)
305: protruding shaft part

The invention claimed is:

1. A flexible device, comprising:
a flexible module; and
a holding body holding the flexible module,
the holding body including:
a first housing and a second housing facing each other when the flexible module is bent; and
a connection section connecting the first housing and the second housing to each other so that the first housing and the second housing are turnable,
a surface of the flexible module which surface faces the first housing and the second housing being fixed to the first housing and the second housing,
the connection section including:
a third housing disposed so as to face a bent part of the flexible module; and
a plurality of turning bodies,
each of the plurality of turning bodies being fixed to the first housing or the second housing, the plurality of turning bodies rolling on the third housing so that a turning axis of the each of the plurality of turning bodies horizontally moves when the flexible module is bent;

the plurality of turning bodies including (i) at least one first turning body which is fixed to the first housing and (ii) at least one second turning body which is fixed to the second housing; and a distance on the third housing between a turning axis of each of the at least one first turning body and a turning axis of each of the at least one second turning body being longer in a state where the flexible device is unfolded than in a state where the flexible device is folded.

2. The flexible device as set forth in claim 1, wherein:
the connection section further includes a slightly-adhesive layer; and
the slightly-adhesive layer has slight adhesion or slight adsorptivity and is provided on a surface of the connection section which surface comes in contact with the bent part of the flexible module.

3. The flexible device as set forth in claim 2, wherein the slightly-adhesive layer is disposed on a surface of the third housing which surface faces the flexible module.

4. The flexible device as set forth in claim 2, wherein:
the connection section further includes a supporting member between the flexible module and the third housing, the supporting member including a plurality of plate-like members and being provided so as to be bendable, through a change in size of a gap between adjacent ones of the plurality of plate-like members, in accordance with turning of each of the first housing and the second housing; and
the slightly-adhesive layer is disposed on a surface of the supporting member which surface faces the flexible module.

5. The flexible device as set forth in claim 4, further comprising a sliding member moving by sliding in accordance with turning of the each of the plurality of turning bodies,
the plurality of plate-like members moving along the sliding member in accordance with the turning of the each of the plurality of turning bodies.

6. The flexible device as set forth in claim 5, wherein the sliding member includes an arc part and a bottom part.

7. The flexible device as set forth in claim 6, wherein:
the arc part of the sliding member has a radius greater than that of the each of the plurality of turning bodies; and
the plurality of plate-like members move on an outer side of a trajectory of a circumference of the each of the plurality of turning bodies in accordance with the turning of the each of the plurality of turning bodies.

8. The flexible device as set forth in claim 5, wherein:
one of the third housing and the sliding member includes a rail in a direction perpendicular to the turning axis of the each of the plurality of turning bodies; and
the other of the third housing and the sliding member includes a protrusion which is fitted in a groove of the rail.

9. The flexible device as set forth in claim 1, wherein the bent part of the flexible module in a state where the flexible device is being folded or being unfolded has a flexion radius smaller than that in a state where the flexible device is folded.

10. The flexible device as set forth in claim 9, further comprising a movement mechanism which, in the state where the flexible device is folded, causes at least one of (i) the third housing and (ii) the first housing, the second housing, and the flexible module to move with respect to the other so as to cause a change in area of contact between the flexible module and the connection section.

11. The flexible device as set forth in claim 10, wherein:
the movement mechanism is an expansion and contraction mechanism which is provided so as to be expandable and contractible; and
each of the plurality of turning bodies is fixed to the first housing or the second housing through the expansion and contraction mechanism.

12. The flexible device as set forth in claim 1, wherein:
the each of the plurality of turning bodies is a pinion including a plurality of teeth which are parallel to the turning axis;
the third housing includes a rack which is provided parallel to a direction perpendicular to the turning axis of the each of the plurality of turning bodies, the rack including a plurality of teeth which are parallel to the turning axis; and
the each of the plurality of turning bodies turns on the rack while being engaged with the rack.

13. The flexible device as set forth in claim 1, wherein the flexible module is a display panel.

* * * * *